United States Patent
Hsu et al.

(10) Patent No.: US 12,355,370 B2
(45) Date of Patent: Jul. 8, 2025

(54) SELF-ALIGNED DIELECTRIC LINER STRUCTURE FOR PROTECTION IN MEMS COMB ACTUATOR

(71) Applicant: Taiwan Semiconductor Manufacturing Company, Ltd., Hsin-Chu (TW)

(72) Inventors: Chiao-Chun Hsu, Tainan (TW); Chih-Ming Chen, Hsinchu (TW); Chung-Yi Yu, Hsin-Chu (TW); Lung Yuan Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 387 days.

(21) Appl. No.: 17/842,101

(22) Filed: Jun. 16, 2022

(65) Prior Publication Data

US 2022/0311357 A1 Sep. 29, 2022

Related U.S. Application Data

(62) Division of application No. 16/801,350, filed on Feb. 26, 2020, now Pat. No. 11,387,748.

(Continued)

(51) Int. Cl.
*H02N 1/00* (2006.01)

(52) U.S. Cl.
CPC .................................. *H02N 1/008* (2013.01)

(58) Field of Classification Search
CPC .......... G01P 2015/0814; G01P 15/125; B81C 1/0015; B81C 1/00968; B81C 2201/112;
(Continued)

(56) References Cited

U.S. PATENT DOCUMENTS

| 6,133,670 A | 10/2000 | Rodgers et al. |
| 8,039,922 B2 | 10/2011 | Ni |

(Continued)

FOREIGN PATENT DOCUMENTS

| CN | 107783280 A | * | 3/2018 | .......... G01S 7/4817 |
| JP | 2012044859 A | | 3/2012 | |
| WO | WO-2016143804 A1 | * | 9/2016 | |

OTHER PUBLICATIONS

R. He, P.Yang Nature Nanotechnology 1(2006) 42-46, Oct. 2006.

(Continued)

*Primary Examiner* — Edward Chin
(74) *Attorney, Agent, or Firm* — Eschweiler & Potashnik, LLC

(57) ABSTRACT

In some embodiments, the present disclosure relates to a microelectromechanical system (MEMS) comb actuator including a comb structure. The comb structure includes a support layer having a first material and a plurality of protrusions extending away from a first surface of the support layer in a first direction. The plurality of protrusions are also made of the first material. The plurality of protrusions are separated along a second direction parallel to the first surface of the support layer. The MEMS comb actuator may further include a dielectric liner structure that continuously and completely covers the first surface of the support layer and outer surfaces of the plurality of protrusions. The dielectric liner structure includes a connective portion that continuously connects topmost surfaces of at least two of the plurality of protrusions.

20 Claims, 19 Drawing Sheets

Related U.S. Application Data

(60) Provisional application No. 62/894,033, filed on Aug. 30, 2019.

(58) Field of Classification Search
CPC ............ B81C 1/00063; B81C 1/00547; B81C 2201/019
See application file for complete search history.

(56) References Cited

U.S. PATENT DOCUMENTS

| | | | |
|---|---|---|---|
| 8,466,070 | B2 | 6/2013 | Chou et al. |
| 9,487,386 | B2 | 11/2016 | Dehe |
| 10,259,701 | B2 | 4/2019 | Dehe |
| 10,559,568 | B1 * | 2/2020 | Huang ................... H10D 86/01 |
| 2004/0081391 | A1 | 4/2004 | Ko et al. |
| 2004/0229440 | A1 | 11/2004 | Kim et al. |
| 2006/0203319 | A1 | 9/2006 | Kouma et al. |
| 2009/0225387 | A1 | 9/2009 | Mizuno et al. |
| 2015/0021722 | A1 | 1/2015 | Dehe et al. |
| 2017/0155373 | A1 | 6/2017 | Ruby et al. |

OTHER PUBLICATIONS

Faez Saleh Ahmed Ba Tis. "Three-Degrees-of-Freedom MEMS Electrostatic Out-Of-Plane Comb-Drive Actuator for Auto-Focus and Image Stabilization in Phone Cameras." Mechanical and Industrial Engineering Department University of Toronto, published in 2014.

Walraven et al. "Introduction to Microelectromechanical Systems (MEMS) Materials, Fabrication Processes and Failure Analysis." Sandia National Laboratories, Albuquerque, NM, published in 2012.

Maheswaran et al. "A Study on Performance-driven Microfabrication Methods for MEMS Comb-drive Actuators." Journal of Applied Sciences, vol. 12 (10): 920-928, 2012 published in 2012.

EMWORKS. "Electro-structural analysis of a MEMS Comb Drive Actuator." The date of publication is unknown. Retrieved online on Aug. 22, 2019 from https://www.emworks.com/application/electro-structural-analysis-of-a-mems-comb-drive-actuator.

Banees et al. "Fabrication of a MEMS Comb Drive Actuator." 34th Annual Microelectronic Engineering Conference, published May 2016.

Gupta et al. "Optimizing the Performance of MEMS Electrostatic Comb Drive Actuator with Different Flexure Springs." Excerpt from the Proceedings of the 2012 COMSOL Conference in Bangalore, published in 2012.

Gale, Bruce. "Fundamentals of Micromachining." The University of Utah, published on May 14, 2012.

Dechev, N. "Electrostatic Sensors and Actuators." University of Victoria, published May 2, 2016.

Patel et al. "Performance and Reliability of MEMS Gyroscopes at High Temperatures." 2010 12th IEEE Intersociety Conference on Thermal and Thermomechanical Phenomena in Electronic Systems, published on Jul. 1, 2010.

Plasma-Therm. "PECVD." Published in 2019.

Non-Final Office Action dated Sep. 14, 2021 for U.S. Appl. No. 16/801,350.

Notice of Allowance dated Feb. 18, 2022 for U.S. Appl. No. 16/801,350.

* cited by examiner

SELF-ALIGNED DIELECTRIC LINER STRUCTURE FOR PROTECTION IN MEMS COMB ACTUATOR

REFERENCE TO RELATED APPLICATIONS

This application is a Divisional of U.S. application Ser. No. 16/801,350, filed on Feb. 26, 2020, which claims the benefit of U.S. Provisional Application No. 62/894,033, filed on Aug. 30, 2019. The contents of the above-referenced patent applications are hereby incorporated by reference in their entirety.

BACKGROUND

Microelectromechanical systems (MEMS) devices are becoming increasingly common in modern day devices (e.g., smart speakers, hearing aids, camera devices). Many MEMS devices may be classified as a sensor or an actuator. A MEMS sensor senses the presence of an external condition (e.g., sound waves, light, magnetic signals) and converts it into an electrical signal (e.g., voltage, current) for processing. A MEMS actuator utilizes an electrical signal (e.g., voltage, current) to produce an external condition (e.g., a sound wave, light, magnetic signal). A promising candidate for a fast and low power consumption MEMS actuator is a MEMS comb actuator that utilizes electrostatic principles to produce a mechanical movement based on an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
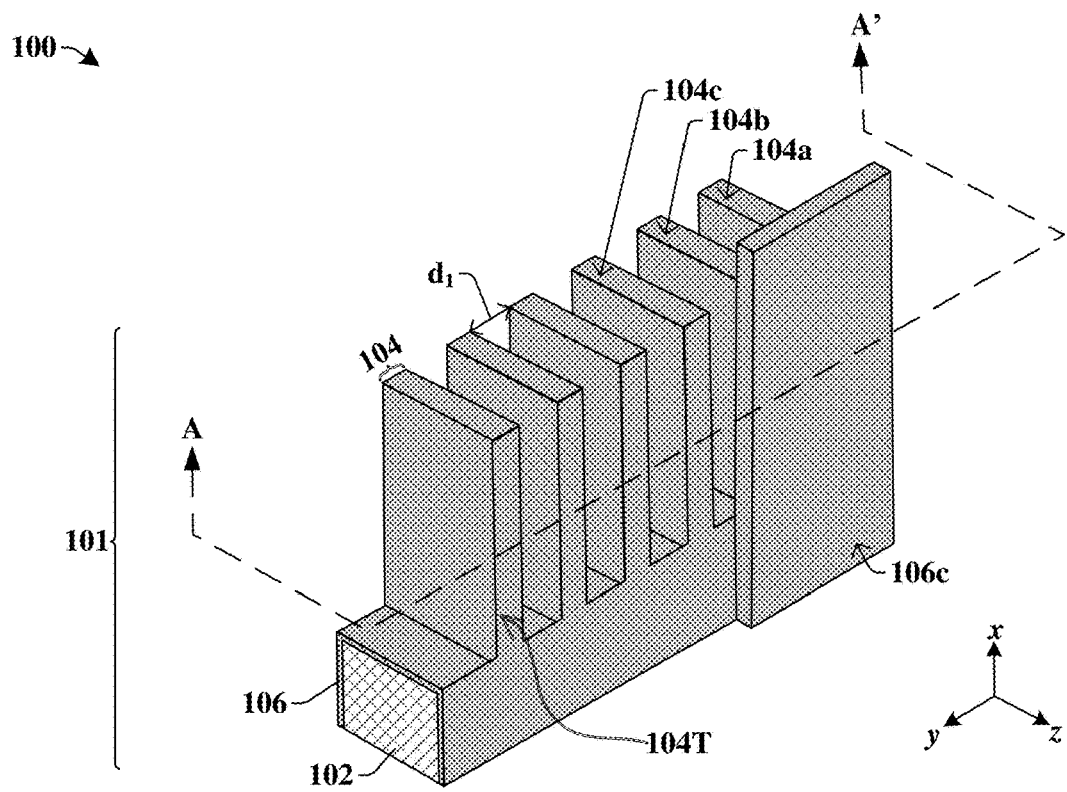
FIG. 1 illustrates a perspective view of some embodiments of a microelectromechanical systems (MEMS) comb structure comprising semiconductor protrusions continuously covered by dielectric liner structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A microelectromechanical system (MEMS) comb actuator may be used in devices such as, for example, gyroscopes or optical image stabilizer systems in cell phone cameras. In some embodiments, a MEMS comb actuator includes a first comb structure and a second comb structure that move towards and away from one another upon electrical signals during operation. The first comb structure may comprise a first support layer and protrusions extending outward from the first support layer. Further, a dielectric liner structure may be arranged over the first comb structure, thereby continuously covering outer surfaces of the protrusions and surfaces of the first support layer. The dielectric liner structure is substantially thin such that nearest neighbors of the protrusions are spaced apart from one another by a first distance. The first distance is large enough to allow protrusions of the second comb structure to fit between nearest neighbors of the protrusions of the first comb structure during operation of the MEMS comb actuator. The dielectric liner structure is also thick enough to electrically isolate each of the protrusions from one another such that the protrusions each have their own electrostatic potential during operation.

To form a comb structure, a substrate may be patterned to form trench structures, wherein each trench structure is spaced apart by a protrusion of the substrate. A first dielectric layer may be deposited over the substrate and within the trench structures. A semiconductor material (e.g., polysilicon) may be formed within each trench structure to form protrusions protruding from a support layer, wherein the protrusions comprising the semiconductor material are within the trench structures and are separated by the protrusions of the substrate. In some embodiments, portions of the first dielectric layer that directly overlie the protrusions of the substrate may be removed, and a second dielectric layer may be formed over exposed surfaces of the protrusions of the semiconductor material. Then, the first and/or second dielectric layers that directly overlie the protrusions of the substrate may be selectively removed through a patterning process.

However, the removal of the first and/or second dielectric layers may result in excess dielectric material on the protrusions of the semiconductor material and/or may result in a very thin or discontinuous coating of the dielectric material on the protrusions of the semiconductor material. If there is excess dielectric material on the protrusions of the semiconductor material, the excess dielectric material may collide with an opposing comb structure during operation of the MEMS comb actuator. Further, if there is a very thin or discontinuous coating of the dielectric material on the protrusions of the semiconductor material, the protrusions of the semiconductor material may not be protected during proceeding manufacturing steps (e.g., substrate patterning) and/or the protrusions of the semiconductor material may not be electrically insulated from one another during operation of the MEMS comb actuator so that each protrusion of the semiconductor material has an independent electrostatic potential.

Various embodiments of the present disclosure provide a method of forming a comb structure having a dielectric liner structure that continuously covers each protrusion of the comb structure for sufficient electrical and structural protection. For example, in some embodiments of the present disclosure, after the formation of a support layer and protrusions over a substrate that is covered with a first dielectric layer, a second dielectric layer is formed over the protrusions prior to removal of portions of the first dielectric layer. After the formation of the second dielectric layer, a planarization process (e.g., chemical mechanical planarization (CMP)) is performed to remove portions of the first and/or second dielectric layers overlying the substrate. After the planarization process, upper surfaces of the first dielectric layer and the second dielectric layer may be substantially coplanar or in other words, aligned with one another. Then, a third dielectric layer is formed over the substrate, which may be substantially planar due to the formation of the third dielectric layer over the substantially coplanar first and second dielectric layers. In other words, the third dielectric layer may self-align with the substantially coplanar first and second dielectric layers, such that the third dielectric layer is substantially planar. In some embodiments, a patterning process is performed to selectively remove portions of the third dielectric layer overlying the substrate. The substrate may then be released. Because the upper surfaces of the first dielectric layer and the second dielectric layer were aligned prior to the formation of the third dielectric layer and third dielectric layer self-aligns to the first and second dielectric layers, the patterning process of the third dielectric layer may be more controllable in some embodiments.

Thus, by conducting the planarization process and by adding extra dielectric layers (e.g., the third dielectric layer), the resulting dielectric liner structure comprising the first, second, and third dielectric layers has a more uniform and controllable thickness, resulting in a more reliable MEMS comb actuator to electrically and structurally protect protrusions of the comb structure during operation.

FIG. 1 illustrates a perspective view 100 of some embodiments of a MEMS comb structure wherein at least two protrusions of the MEMS comb structure have topmost surfaces connected by a dielectric liner structure.

The MEMS comb structure 101 of FIG. 1 includes a support layer 102 and protrusions 104 extending from the support layer 102 in a first direction x. In some embodiments, the support layer 102 and the protrusions 104 comprise a same, first material, and the support layer 102 and the protrusions 104 are covered by a dielectric liner structure 106. Thus, in the perspective view 100 of FIG. 1, the protrusions 104 of the MEMS comb structure 101 are not visible as indicated by the double line bracket, and it will be appreciated that the protrusions 104 are beneath the dielectric liner structure 106. In some embodiments, the first material of the support layer 102 and the protrusions 104 comprise a semiconductor material. For example, in some embodiments, the support layer 102 and the protrusions 104 may comprise polysilicon. Further, in some embodiments, the dielectric liner structure 106 comprises a dielectric material such as, for example, silicon nitride, silicon dioxide, or the like. Thus, the dielectric liner structure 106 comprises an insulator to provide electrical isolation amongst the protrusions 104 during operation of the MEMS comb structure 101 such that each protrusion 104 may maintain an individual electrostatic potential during operation.

In some embodiments, the protrusions 104 include at least a first protrusion 104a, a second protrusion 104b, and a third protrusion 104c. The first protrusion 104a, the second protrusion 104b, and the third protrusion 104c may be spaced apart from one another in a second direction y that is different than the first direction x. In some embodiments, the first direction x may be perpendicular to the second direction y. In some embodiments, the first protrusion 104a may be separated from the second protrusion 104b by a first distance $d_1$, and the second protrusion 104b may be separated from the third protrusion 104c by the same, first distance $d_1$. In other embodiments, the first distance $d_1$ may vary between the protrusions 104.

Further, in some embodiments of the MEMS comb structure 101 of FIG. 1, at least two of the protrusions 104 may have topmost surfaces 104T that are continuously connected to one another by a connective portion 106c of the dielectric liner structure 106. For example, in some embodiments, the connective portion 106c of the dielectric liner structure 106 connects the topmost surface 104T of the first protrusion 104a to the topmost surface 104T of the second protrusion 104b. In some embodiments, the connective portion 106c of the dielectric liner structure 106 is spaced apart from the third protrusion 104c. A third direction z that is different from the first direction x and that is different than the second direction y may be normal to the topmost surfaces 104T of the protrusions 104. In some embodiments, the third direction z is perpendicular to the first and second directions x, y. In some embodiments, by connecting the first and second protrusions 104a, 104b together with the connective portion 106c of the dielectric liner structure 106, the electrostatic force of the first and second protrusions 104a, 104b is increased, which may be desirable in certain applications. Further, the topmost surfaces 104T of the protrusions 104 may not be visible from the perspective view 100 as indicated by the double line arrow, and it will be appreciated that the topmost surfaces 104T of the protrusions 104 are beneath the dielectric liner structure 106.

Figure 2:
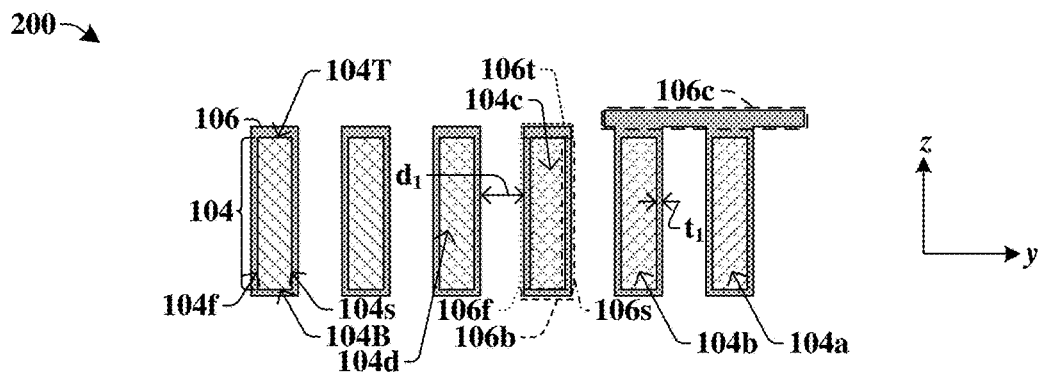
FIGS. 2 and 3 illustrate cross-sectional views of some embodiments corresponding to the perspective view of FIG. 1.
Figure 3:
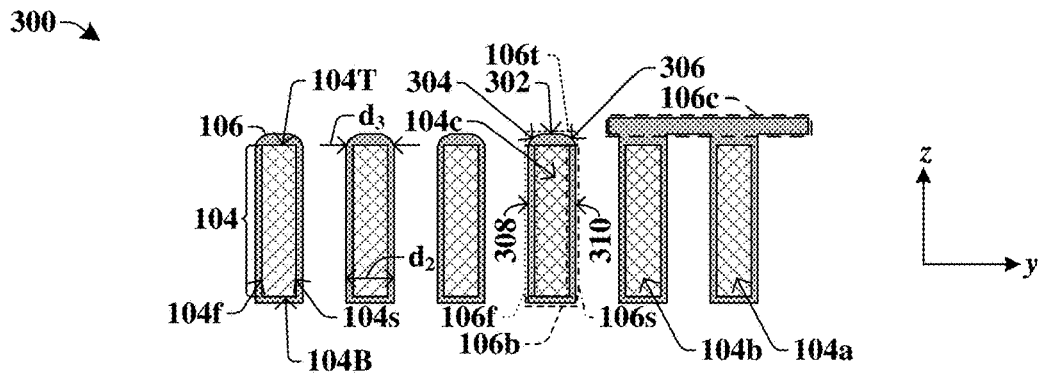

FIGS. 2 and 3 illustrate cross-sectional views 200 and 300, respectively, of some embodiments of a MEMS comb structure that may correspond to cross-section line AA' of FIG. 1, wherein the dielectric liner structure completely and continuously covers the protrusions.

As illustrated in the cross-sectional view 200 of FIG. 2, the protrusions 104 comprising the first material are visible, and the dielectric liner structure 106 completely and continuously covers outer surfaces of each protrusion 104. Further, the first distance $d_1$ between protrusions 104 may be measured in the second direction y and may be measured between outer surfaces of the protrusions 104, as illustrated in FIG. 2. In some embodiments, from the cross-sectional view 200, the dielectric liner structure 106 may have a first thickness $t_1$ that is a minimum thickness of the dielectric liner structure 106 surrounding outer surfaces of the protrusions 104. The first thickness $t_1$ may be thin enough to allow the comb structure to function mechanically (e.g., bending or movement of protrusions 104 upon electrical signal) while still providing sufficient electrical isolation amongst protrusions 104. For example, in some embodiments, the first thickness $t_1$ is in a range of between approximately 0.5 micrometers and approximately 1 micrometer. It will be appreciated that other values for the first thickness $t_1$ are also within the scope of the disclosure.

In some embodiments, the dielectric liner structure 106 comprises a top portion 106t that is arranged on the topmost surface 104T of the third protrusion 104c, a first sidewall portion 160f that is arranged directly along a first sidewall 104f of the third protrusion 104c, a second sidewall portion 106s that is arranged directly along a second sidewall 104s of the third protrusion 104c, and a bottom portion 106b that is arranged beneath a bottommost surface 104B of the third protrusion 104c. The third direction z may be normal to the bottommost surface 104B and the topmost surface 104T of the third protrusion 104c, and the second direction y may be normal to the first sidewall 104f and the second sidewall 104s of the third protrusion 104c. Further, the first sidewall 104f, the second sidewall 104s, the topmost surface 104T, and the bottommost surface 104B may be continuously connected to one another. The top portion 106t and the bottom portion 106b of the dielectric liner structure 106 may be coupled to one another by the first sidewall portion 106f and the second sidewall portion 106s of the dielectric liner structure 106. Further, the first sidewall portion 106f may be separated from the second sidewall portion 106s in the second direction y by the third protrusion 104c, and the top portion 106t may be separated from the bottom portion 106b in the third direction z by the third protrusion 104c. Uppermost surfaces of the first sidewall portion 106f and the second sidewall portion 106s are not above the topmost surface 104T of the third protrusion 104c, and lowermost surfaces of the first sidewall portion 106f and the second sidewall portion 106s are not below the bottommost surface 104B of the third protrusion 104c.

In some embodiments, by conducting a planarization process and by adding extra dielectric layers during a self-aligned manufacturing process to form the dielectric liner structure 106, the first distance $d_1$ between the third protrusion 104c and a fourth protrusion 104d may be substantially constant when measured throughout the third direction z. In other words, the first distance $d_1$ when measured from the top portion 106t may be substantially the same as the first distance $d_1$ when measured from the bottom portion 106b, which may be also substantially the same as the first distance $d_1$ when measured from the first sidewall portion 106f, for example. The substantially constant first distance $d_1$ throughout the third direction z indicates, in some embodiments, that the dielectric liner structure 106 does not comprise portions that are too thin or portions that are too thick. Further, the self-aligned manufacturing process to form the dielectric liner structure 106 ensures that an outer surface of the first sidewall portion 106f is substantially coplanar or aligned with a first outer surface of the top portion 106t and that an outer surface of the second sidewall portion 106s is substantially coplanar or aligned with a second outer surface of the top portion 106t. In such embodiments, the dielectric liner structure 106 is more reliable in electrically and structurally protecting the protrusions 104 of the MEMS comb structure (101) during manufacturing and operation.

Further, in some embodiments, the first sidewall portion 106f and the second sidewall portion 106s of the dielectric liner structure 106 may each have the first thickness $t_1$ measured in the second direction y that is substantially constant as first thickness $t_1$ measurements are conducted throughout the third direction z. The third protrusion 104c may be arranged between the second and fourth protrusions 104b, 104d, and the fourth protrusion 104d may be separated from the connective portion 106c of the dielectric liner structure 106. Further, in some embodiments, the connective portion 106c of the dielectric liner structure 106 has a top surface that is above a top surface of the top portion 106t of the dielectric liner structure 106. Because of the planarization process of the self-aligned manufacturing process, the top surface of the top portion 106t of the dielectric liner structure 106 is substantially planar, in some embodiments. Further, in some embodiments, the top surface of the connective portion 106c of the dielectric liner structure 106 is also substantially planar due to the planarization process of the self-aligned manufacturing process. Thus, during operation, the dielectric liner structure 106 may sufficiently cover and protect the protrusions 104 of the MEMS comb structure (101 of FIG. 1).

As illustrated in the cross-sectional view 300 of FIG. 3, in some embodiments, the top portion 106t of the dielectric liner structure 106 may comprise a topmost surface 302 that is coupled to an outermost sidewall 308 of the first sidewall portion 106f of the dielectric liner structure 106 and an outermost sidewall 310 of the second sidewall portion 106s of the dielectric liner structure 106 through a first rounded surface 304 of the top portion 106t and a second rounded surface 306 of the top portion 106t, respectively. In some embodiments, the connective portion 106c of the dielectric liner structure 106 does not comprise rounded surfaces. In some embodiments, with respect to a set of axes defined by the third direction z versus the second direction y, the first and second rounded surfaces 304, 306 are concave down from the cross-sectional view 300.

Further, in some embodiments, the dielectric liner structure 106 may comprise a second distance $d_2$ measured in the second direction y between the outermost sidewall 308 of the first sidewall portion 106f and the outermost sidewall 310 of the second sidewall portion 106s. The second distance $d_2$ may be a maximum distance between the outermost sidewall 308 of the first sidewall portion 106f and the outermost sidewall 310 of the second sidewall portion 106s. Further, in some embodiments, the top portion 106t of the dielectric liner structure 106 may comprise a third distance $d_3$ that is a maximum distance of the top portion 106t measured in the second direction y. The third distance $d_3$ may be measured between outermost sidewalls of the top portion 106t and in the second direction y. In some embodiments, the third distance $d_3$ is about equal to the second distance $d_2$. Further, the third protrusion 104c is completely and continuously covered by the dielectric liner structure 106.

Figure 4:
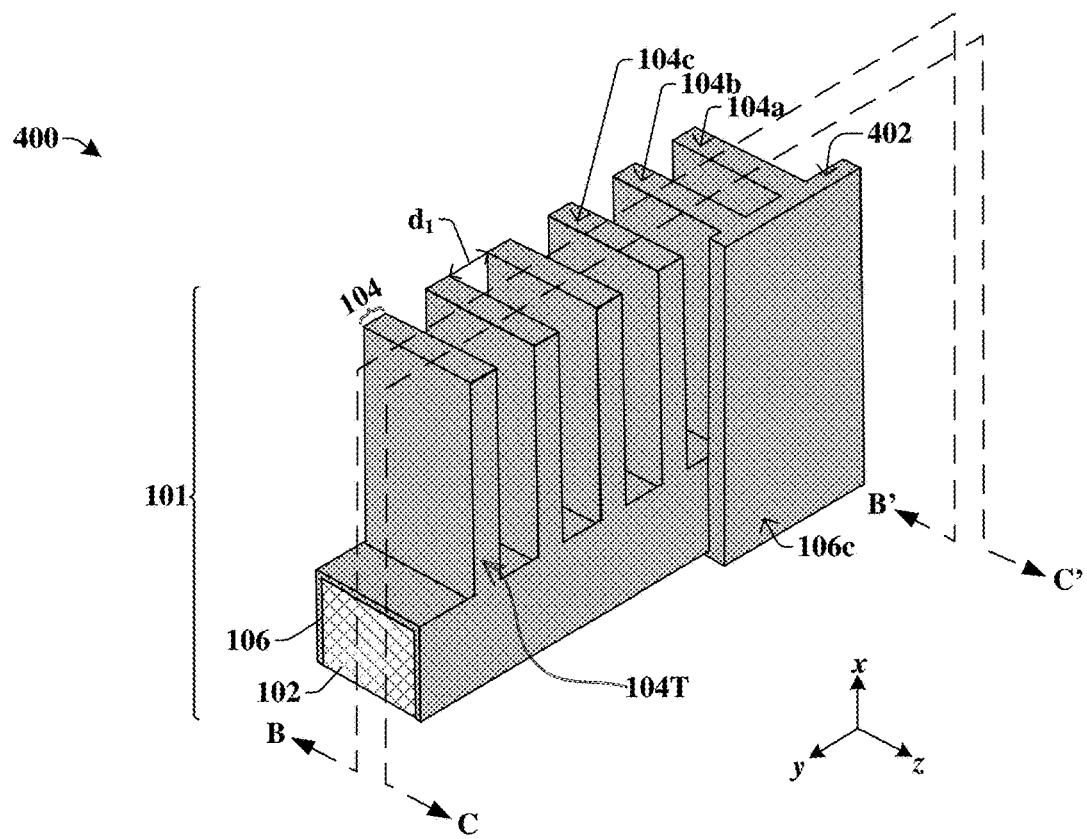
FIG. 4 illustrates a perspective view of some other embodiments of a MEMS comb structure comprising semiconductor protrusions continuously covered by dielectric liner structure.

FIG. 4 illustrates a perspective view 400 of some alternative embodiments of a MEMS comb structure comprising at least two protrusions coupled to one another by a connective portion of a dielectric liner structure.

In some embodiments, the connective portion 106c of the dielectric liner structure 106 has a first sidewall surface 402 that is substantially coplanar with other portions of the dielectric liner structure 106 arranged over the first and second protrusions 104a, 104b. The first direction x is normal to the first sidewall surface 402 of the connective portion 106c of the dielectric liner structure 106.

Figure 5:
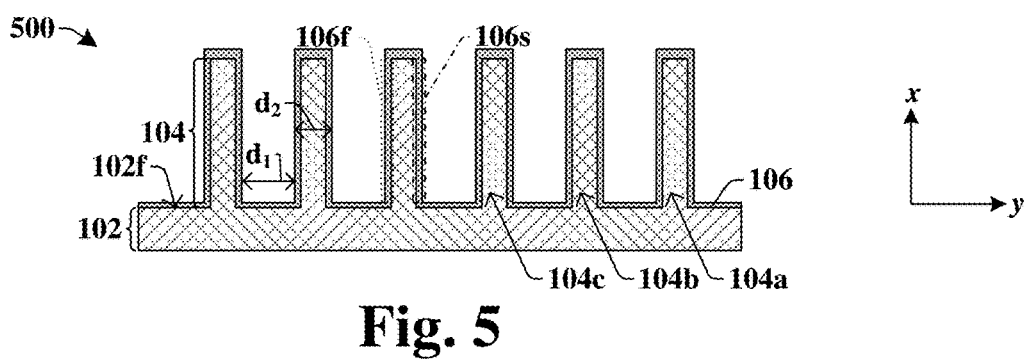
FIGS. 5 and 6 illustrate cross-sectional views of some embodiments corresponding to the perspective view of FIG. 4.

FIG. 5 illustrates a cross-sectional view 500 of some embodiments of a MEMS comb structure that may correspond to cross-section line BB' of FIG. 4.

As illustrated in the cross-sectional view 500 of FIG. 5, the protrusions 104 of the MEMS comb structure protrude in the first direction x from a first surface 102f of the support layer 102. The first direction x may be normal to the first surface 102f of the support layer 102. Thus, in some embodiments, the protrusion 104 are each continuously connected to the support layer 102. Further, in some embodiments, the first distance $d_1$ may be greater than the second distance $d_2$.

Figure 6:
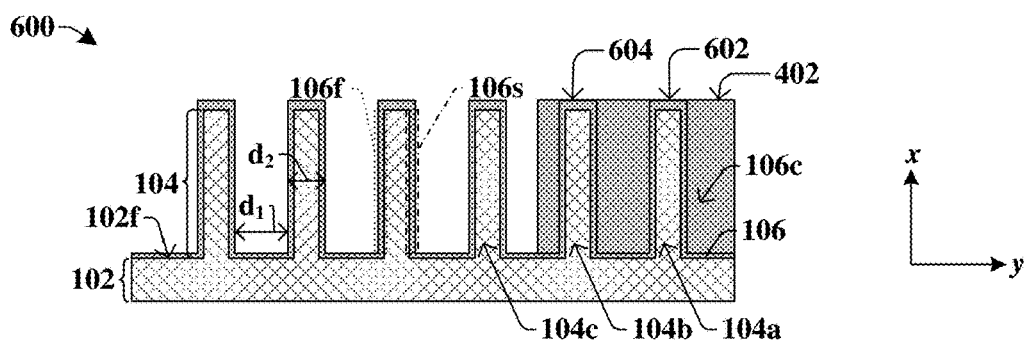

FIG. 6 illustrates a cross-sectional view 600 of some embodiments of a MEMS comb structure that may correspond to cross-section line CC' of FIG. 4.

As illustrated in the cross-sectional view 600 of FIG. 6, in some embodiments, the connective portion 106c of the dielectric liner structure 106 comprises a first sidewall surface 402. In some embodiments, the first direction x is normal to the first sidewall surface 402 of the connective portion 106c. In some embodiments, the dielectric liner structure 106 on the first protrusion 104a of the MEMS comb structure (101 of FIG. 4) comprises a first sidewall 602, and the dielectric liner structure 106 on the second protrusion 104b of the support layer 102 comprises a second sidewall 604. In some embodiments, the first direction x may be normal to the first sidewall 602 of the dielectric liner structure 106 on the first protrusion 104a and the second sidewall 604 of the dielectric liner structure 106 on the second protrusion 104b. In some embodiments, the first sidewall surface 402 of the connective portion 106c, the first sidewall 602 of the dielectric liner structure 106 on the first protrusion 104a, and the second sidewall 604 of the dielectric liner structure 106 on the second protrusion 104b are substantially coplanar. In other embodiments, the first sidewall surface 402 of the connective portion 106c may be above or below the first sidewall 602 of the dielectric liner structure 106 on the first protrusion 104a and the second sidewall 604 of the dielectric liner structure 106 on the second protrusion 104b from the cross-sectional view 600 of FIG. 6.

Figure 7A:
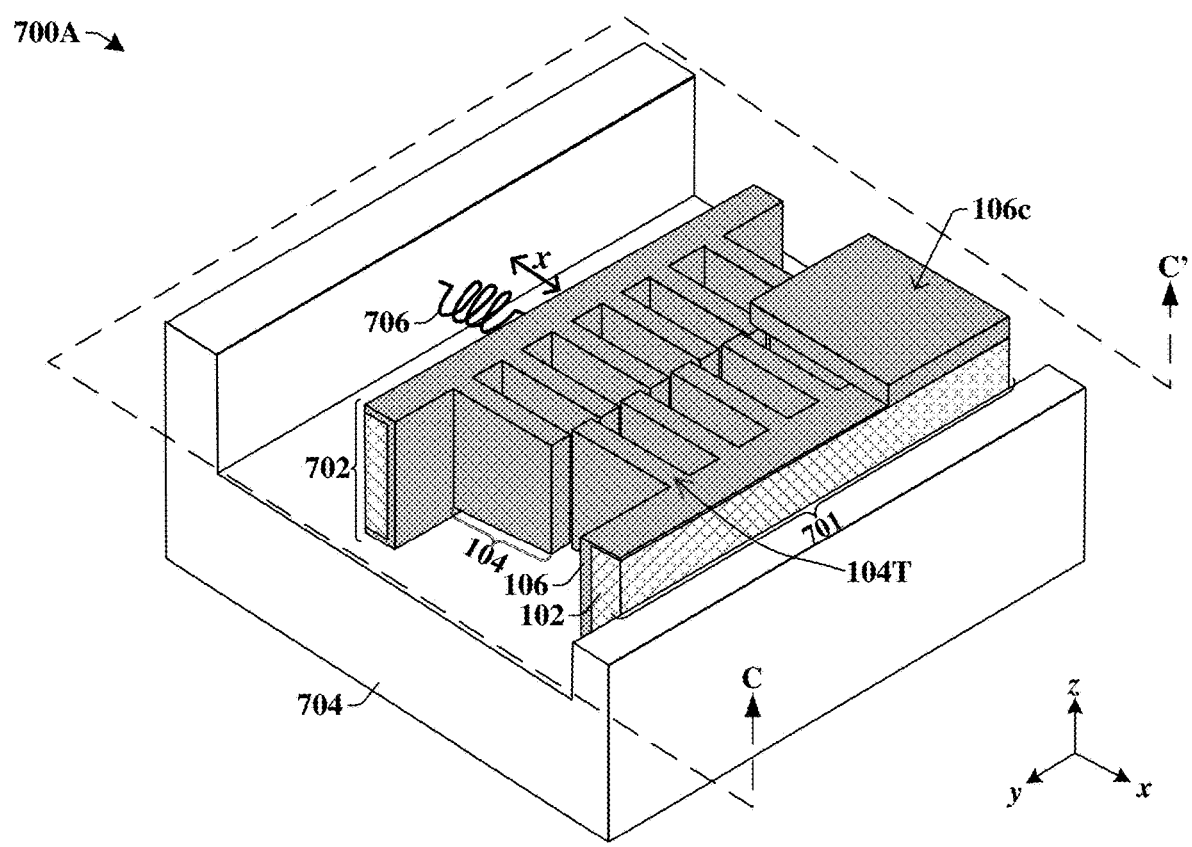
FIGS. 7A-C illustrate various views of some embodiments of positions of a first MEMS comb structure and a second MEMS comb structure during operation, wherein a dielectric liner structure of the first MEMS comb structure does not contact a dielectric liner structure of the second MEMS comb structure.
Figure 7B:
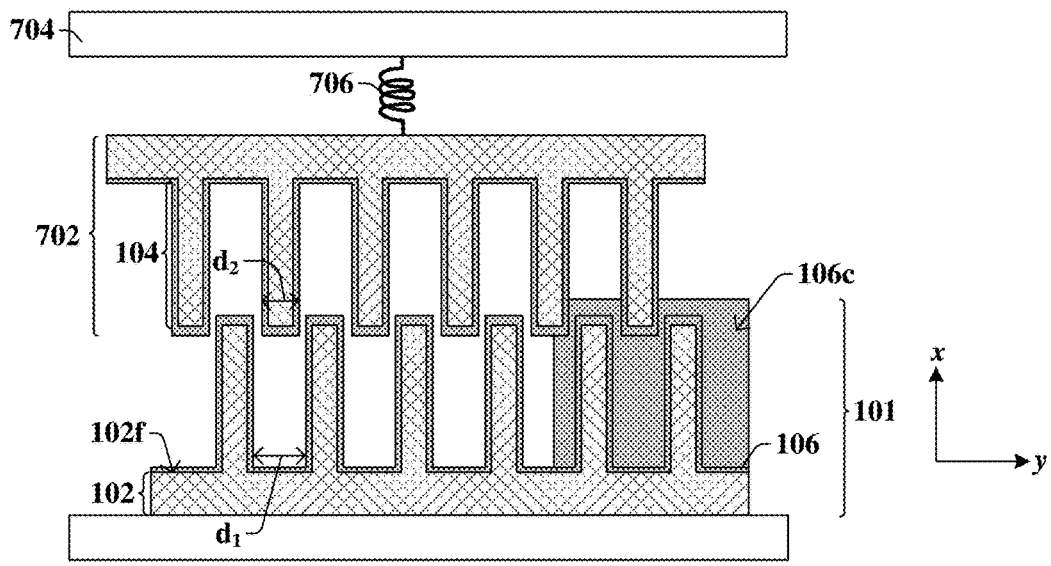
Figure 7C:
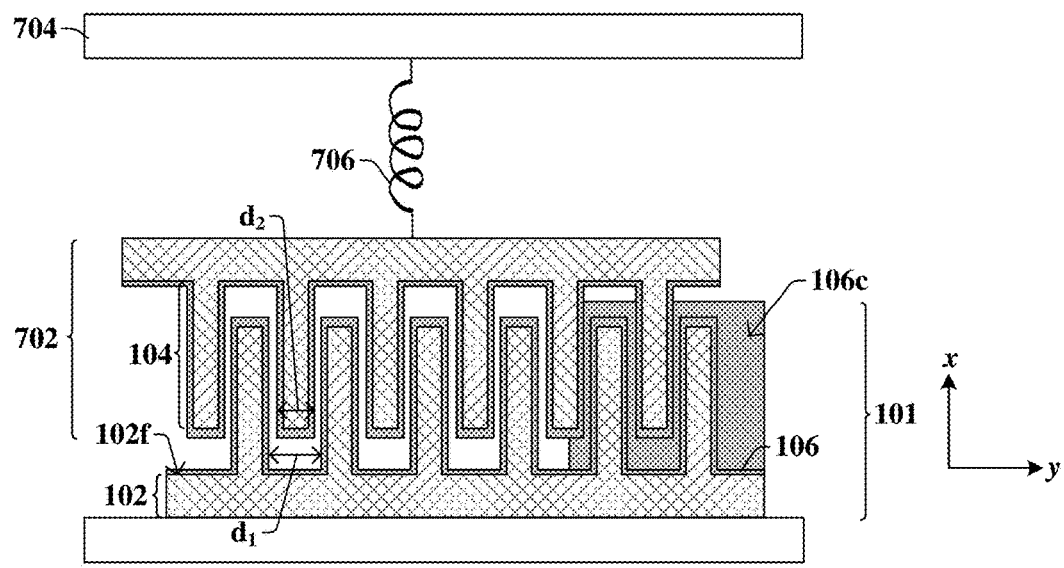

FIGS. 7A-C illustrate various views 700A-C of some embodiments of a MEMS comb actuator comprising a first comb structure and a second comb structure moving away and towards each other in a first direction.

As illustrated in perspective view 700A of FIG. 7A, in some embodiments of a MEMS comb actuator, a first comb structure 701 is arranged facing a second comb structure 702 in the first direction x. In such embodiments, protrusions 104 of the first comb structure 701 are configured to fit between protrusions 104 of the second comb structure 702. During operation, an electrical signal (e.g., voltage, current) may be applied to the first and/or second comb structures 701, 702, and the first and/or second comb structures 701, 702 may move in response to an electrostatic force created within the first and second comb structure 701, 702 by the electrical signal. In some embodiments, the electrical signal (e.g., voltage, current) is applied to the support layer 102, and thus, the protrusions 104. Thus, electrical signal sources and control circuits may be coupled to the first and second comb structures 701, 702, in some embodiments.

Further, in some embodiments, the first comb structure 701 and the second comb structure 702 may be arranged over a support substrate 704. In some embodiments, the support substrate 704 may comprise various other semiconductor devices, such as transistors, and thus, the support substrate 704 may be or comprise a bulk CMOS substrate. In some embodiments, the first comb structure 701 may be directly fixed to the support substrate 704, whereas the second comb structure 702 may be coupled to the support substrate 704 by a spring structure 706. In such embodiments, the second comb structure 702 may move towards and away from the first comb structure 701 in the first direction x through the spring structure 706 upon electrical signals applied to the first and/or second comb structure 701, 702. In other embodiments, the first comb structure 701 may also be coupled to the support substrate 704 by an additional spring structure such that both the first and second comb structures 701, 702 may move towards and away from one another during operation.

In some embodiments, the first comb structure 701 comprises a dielectric liner structure 106 comprising a connective portion 106c, thereby exhibiting similar features as the MEMS comb structure 101 in FIGS. 1 and/or 4. In some embodiments, the second comb structure 702 comprises a dielectric liner structure 106 that does not comprise a connective portion 106c, whereas in other embodiments (not shown), the second comb structure 702 may also comprise a connective portion 106c of the dielectric liner structure 106. Because of a self-aligned manufacturing process that includes adding extra dielectric layers and a planarization process to form the dielectric liner structure 106 on the first comb structure 701 and the dielectric liner structure 106 on the second comb structure 702, the dielectric liner structures 106 completely cover the protrusions 104 of the first and second comb structures 701, 702 to provide electrical and structural protection to the protrusions 104 of the first and second comb structures 701, 702.

FIG. 7B illustrates a cross-sectional view 700B of some embodiments of a MEMS comb actuator that may correspond to cross-section line CC' of FIG. 7A, wherein the first comb structure 701 and the second comb structure 702 are in a first position.

FIG. 7C illustrates a cross-sectional view 700C of some embodiments of a MEMS comb actuator that may correspond to the cross-section line CC' of FIG. 7A, wherein the first comb structure 701 and the second comb structure 702 are in a second position.

Thus, FIGS. 7B and 7C illustrate positions of the first and second comb structures 701, 702 during operation wherein the first and second comb structures 701, 702 move towards and away from each other in the first direction x upon electrical signals (e.g., voltage, current) applied to the first and/or second comb structures 701, 702.

As illustrated in FIGS. 7B and 7C, the protrusions 104 of the first and second comb structures 701, 702 each have a maximum distance equal to the second distance $d_2$, and the protrusions 104 of the first and second comb structures 701, 702 are each spaced apart by the first distance $d_1$. The first distance $d_1$ is greater than the second distance $d_2$ to prevent collision between the protrusions 104 of the first comb structure 701 with protrusions 104 of the second comb structure 702 as the first and second comb structures 701, 702 move between the first and second positions of FIGS. 7A and 7B, respectively. In some embodiments, the first distance $d_1$ of the first comb structure 701 may be different from the first distance $d_1$ of the second comb structure 702, and the second distance $d_2$ of the first comb structure 701 may be different from the second distance $d_2$ of the second comb structure 702.

Nevertheless, the dielectric liner structures 106 of the first and second comb structures 701, 702 and the protrusions 104 of the first and second comb structures 701, 702 are designed to avoid collisions between the first and second comb structures 701, 702 during operation of the MEMS comb actuator. For example, the method of forming a dielectric liner structure 106 at least at FIGS. 13A and 13B includes the formation of a second dielectric layer (1302 of FIG. 13B) over a first dielectric layer (1002 of FIG. 13B) to ensure that the protrusions 104 are fully covered by the dielectric liner structure 106. Further, at least at FIGS. 14A and 14B, the method of forming the dielectric liner structure 106 includes a planarization process to ensure that there is not an excess amount of the first and/or second dielectric layer on the protrusions 104. After the planarization process, upper surfaces of the first dielectric layer are substantially coplanar or aligned with upper surfaces of the second dielectric layer. In some embodiments, an excess amount of the first and/or second dielectric layers (1002, 1302 of FIG. 14B) when forming the dielectric liner structure 106 of the first comb structure 701, for example, would cause the first dielectric liner structure 106 of the first comb structure 701 to collide with the dielectric liner structure 106 of the second comb structure 702. Because a planarization process is used instead of an etching process at FIGS. 14A and 14B, removing too much of the first and/or second dielectric layers (1002, 1302 of FIG. 14B) may be prevented. For example, in some embodiments, if the first and/or second dielectric layers (1002, 1302 of FIG. 14B) are too thin when forming the dielectric liner structure 106 of the first comb structure 701, the dielectric liner structure 106 of the first comb structure 701 may not provide sufficient electrical isolation between the protrusions 104 of the first comb structure 701.

Figure 8A:
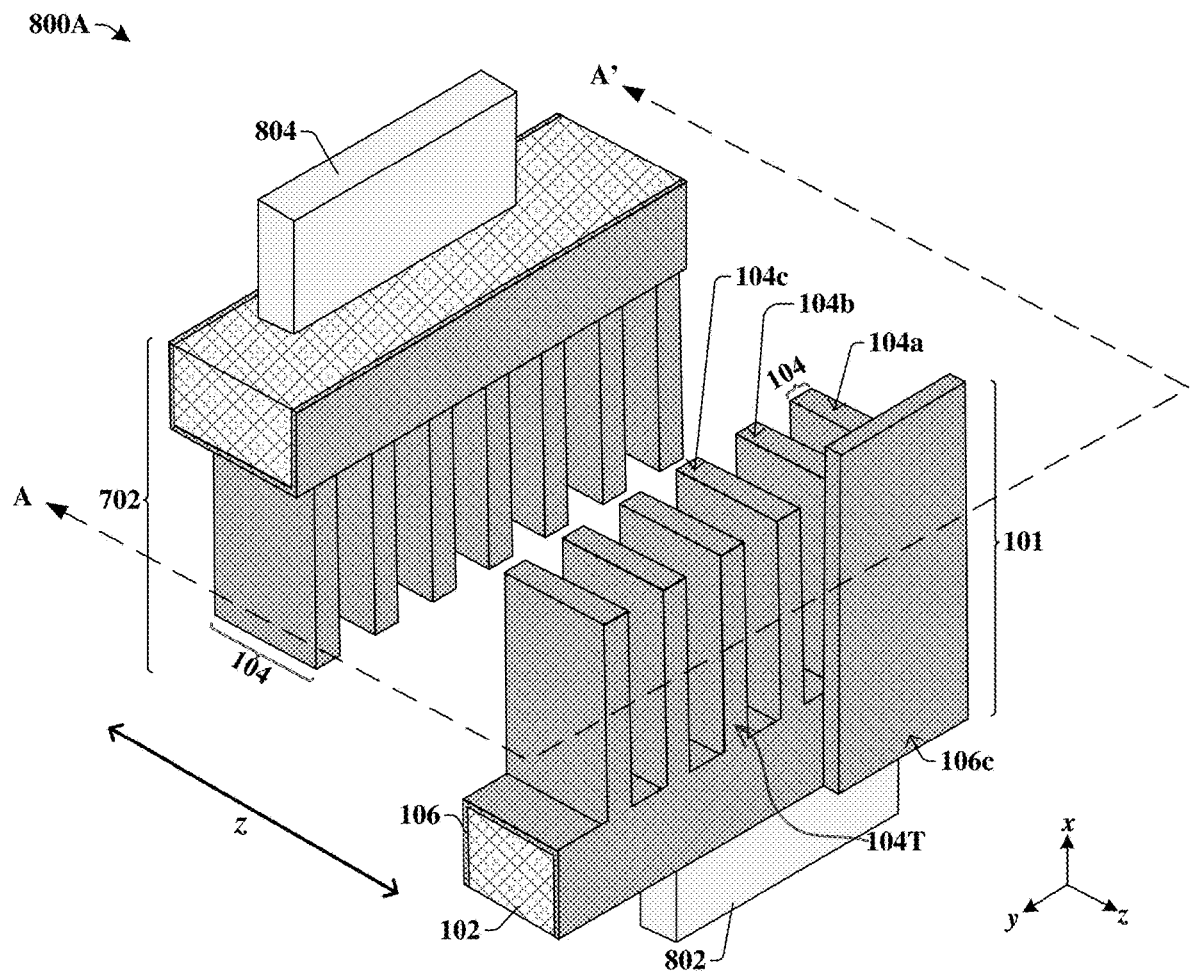
FIGS. 8A-C illustrate various views of some other embodiments of positions of a first MEMS comb structure and a second MEMS comb structure during operation, wherein a dielectric liner structure of the first MEMS comb structure does not contact a dielectric liner structure of the second MEMS comb structure.
Figure 8B:
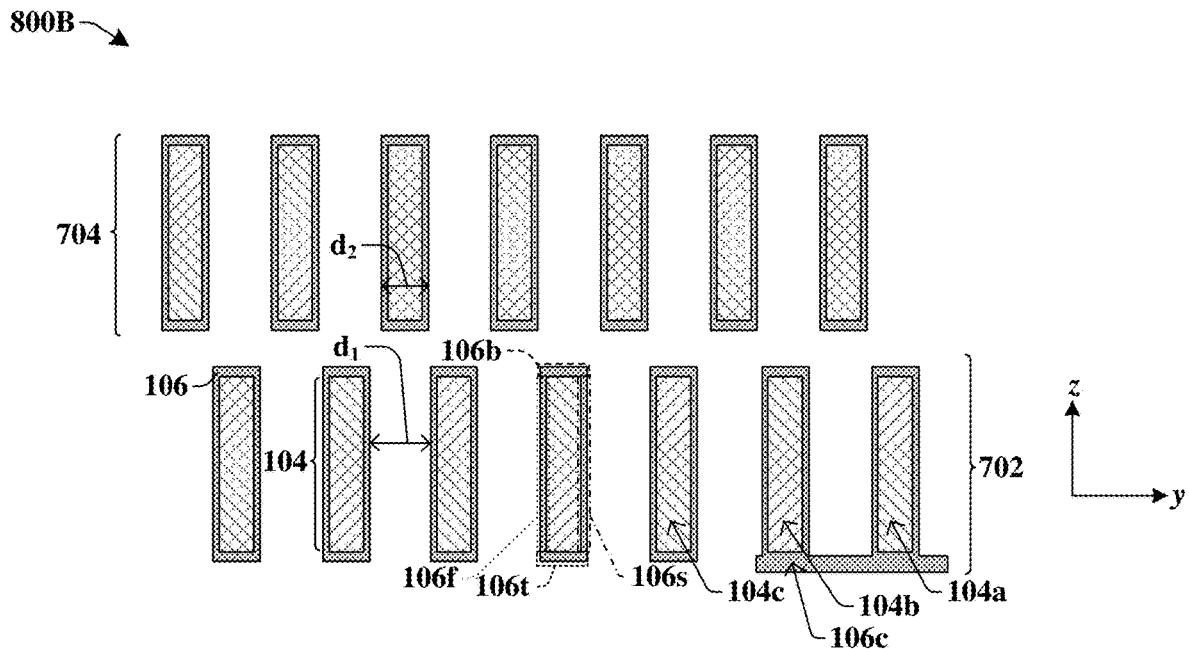
Figure 8C:
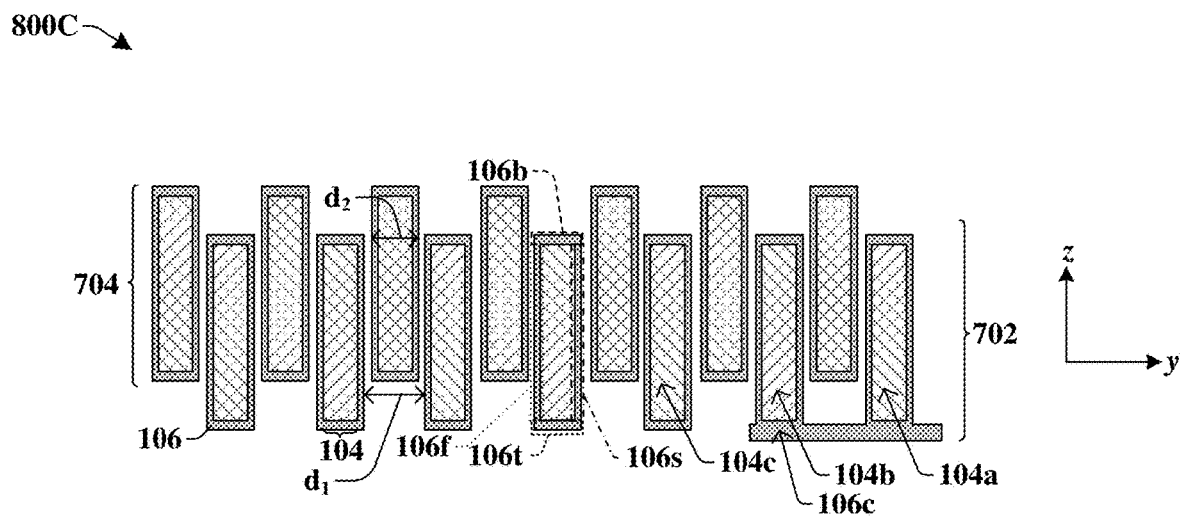

FIGS. 8A-C illustrate various views 800A-C of some other embodiments of a MEMS comb actuator comprising a first comb structure and a second comb structure moving away and towards each other in a third direction.

As illustrated in perspective view 800A of FIG. 8A, in some embodiments, the first comb structure 701 and the second comb structure 702 are configured to move towards and away from one another in the third direction z upon electrical signals (e.g., voltage, current). In some embodiments, a first mechanical support structure 802 is coupled to the support layer 102 of the first comb structure 701, and a second mechanical support structure 804 is coupled to the support layer 102 of the second comb structure 702. It will be appreciated that the first and/or second mechanical support structures 802, 804 may be or comprise, a spring structure like that of the spring structure (706) of FIG. 7A, a support substrate like that of the support substrate (704) of FIG. 7A, or some other structure. The first and/or second mechanical support structures 802, 804 are configured to allow at least one of the first or second comb structures 701, 702 to move along the third direction z during operation of the MEMS comb actuator.

FIG. 8B illustrates a cross-sectional view 800B of some embodiments of a MEMS comb actuator that may correspond to cross-section line AA' of FIG. 8A, wherein the first comb structure 701 and the second comb structure 702 are in a first position.

FIG. 8C illustrates a cross-sectional view 800C of some embodiments of a MEMS comb actuator that may correspond to the cross-section line AA' of FIG. 8A, wherein the first comb structure 701 and the second comb structure 702 are in a second position.

As illustrated in FIGS. 8B and 8C, because the first distance $d_1$ is greater than the second distance $d_2$, the first and second comb structures 701, 702 can move between the first and second positions in the third direction z without the protrusions 104 of the first comb structure 701 colliding with protrusions 104 of the second comb structure 702. Even further, by conducting a planarization process and adding extra dielectric layers during a self-aligned manufacturing process to form the dielectric liner structure 106 of the first comb structure 701 and the dielectric liner structure 106 of the second comb structure 702, the first distance $d_1$ between protrusions 104 of the first comb structure 701 may be substantially constant when measured throughout the third direction z, and the first distance $d_1$ between protrusions 104 of the second comb structure 701 may be substantially constant when measured throughout the third direction z. Further, by conducting a planarization process and adding extra dielectric layers during the self-aligned manufacturing process to form the dielectric liner structure 106 of the first comb structure 701 and the dielectric liner structure 106 of the second comb structure 702, the dielectric liner structure 106 of the first comb structure 701 completely covers outer surfaces of the protrusions 104 of the first comb structure 701, and the dielectric liner structure 106 of the second comb structure 702 completely covers outer surfaces of the protrusions 104 of the second comb structure 702. Therefore, the self-aligned manufacturing process that includes the planarization process and the formation of extra dielectric layers ensures that the dielectric liner structures 106 of the first and second comb structures 701, 702 are thick enough to provide sufficient electrical isolation amongst protrusions 104 while still being thin enough to prevent collisions between the first and second comb structures 701, 702 during operation.

FIGS. 9A-20 illustrate various views 900A-2000 of some embodiments of a method of forming a MEMS comb structure of a MEMS comb actuator using a self-aligned process. Although FIGS. 9A-20 are described in relation to a method, it will be appreciated that the structures disclosed in FIGS. 9A-20 are not limited to such a method, but instead may stand alone as structures independent of the method.

Figure 9A:
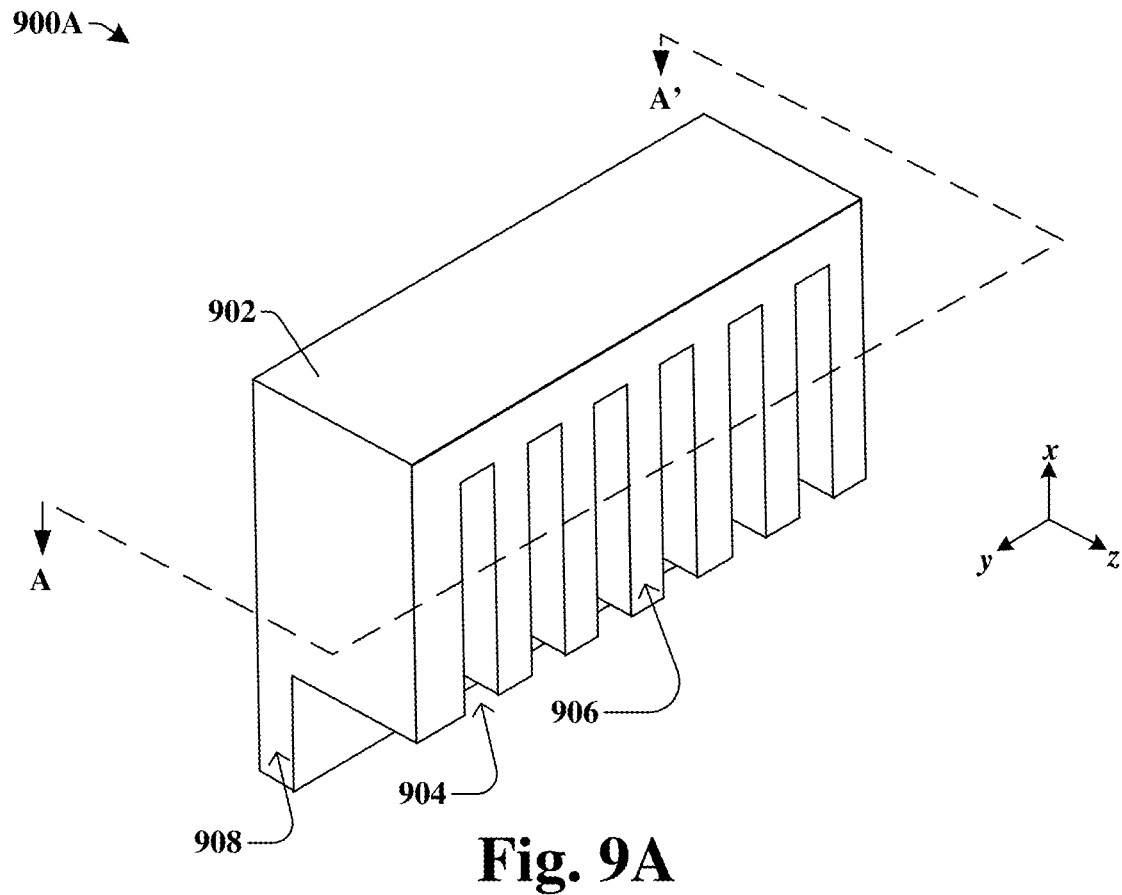
FIGS. 9A-20 illustrate various views of some embodiments of a method of forming a MEMS comb structure comprising semiconductor protrusions lined with a dielectric liner structure through a self-aligned process.

As shown in perspective view 900A of FIG. 9A, a substrate 902 is provided. In some embodiments, the substrate 902 may comprise a semiconductor body (e.g., silicon, CMOS bulk, germanium, silicon-on-insulator, etc.). As shown in FIG. 9A, trench structures 904 are formed in the substrate 902 through, for example, photolithography and removal (e.g., wet etch, dry etch, etc.) processes. Protrusions 906 of the substrate 902 separate the trench structures 904 from one another in a second direction y. In some embodiments, the substrate 902 further comprises a support portion 908 extending in a first direction x away from the trench structures 904. In some embodiments, the first direction x is substantially perpendicular to the second direction y.

Figure 9B:
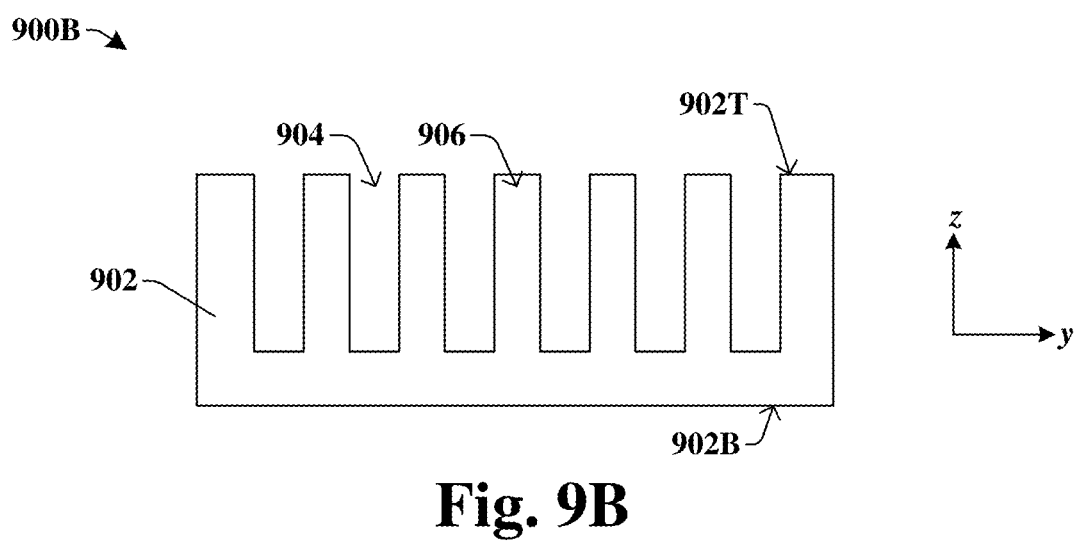

FIG. 9B illustrates a cross-sectional view 900B of some embodiments of the substrate 902 of FIG. 9A along cross-section line AA' of FIG. 9A.

As shown in the cross-sectional view 900B of FIG. 9B, the trench structures 904 of the substrate 902 extend from a topmost surface 902T of the substrate 902 to a bottommost surface 902B of the substrate 902 in a third direction z. However, the trench structures 904 do not extend completely through the substrate 902, in some embodiments. In some embodiments, the topmost surface 902T of the substrate 902 and the bottommost surface 902B of the substrate 902 may be coplanar with a plane substantially normal to the third direction z, which is perpendicular to the second direction y. Further, in some embodiments, the trench structures 904 may be spaced apart from one another in the second direction y by the protrusions 906 of the substrate 902.

Figure 10A:
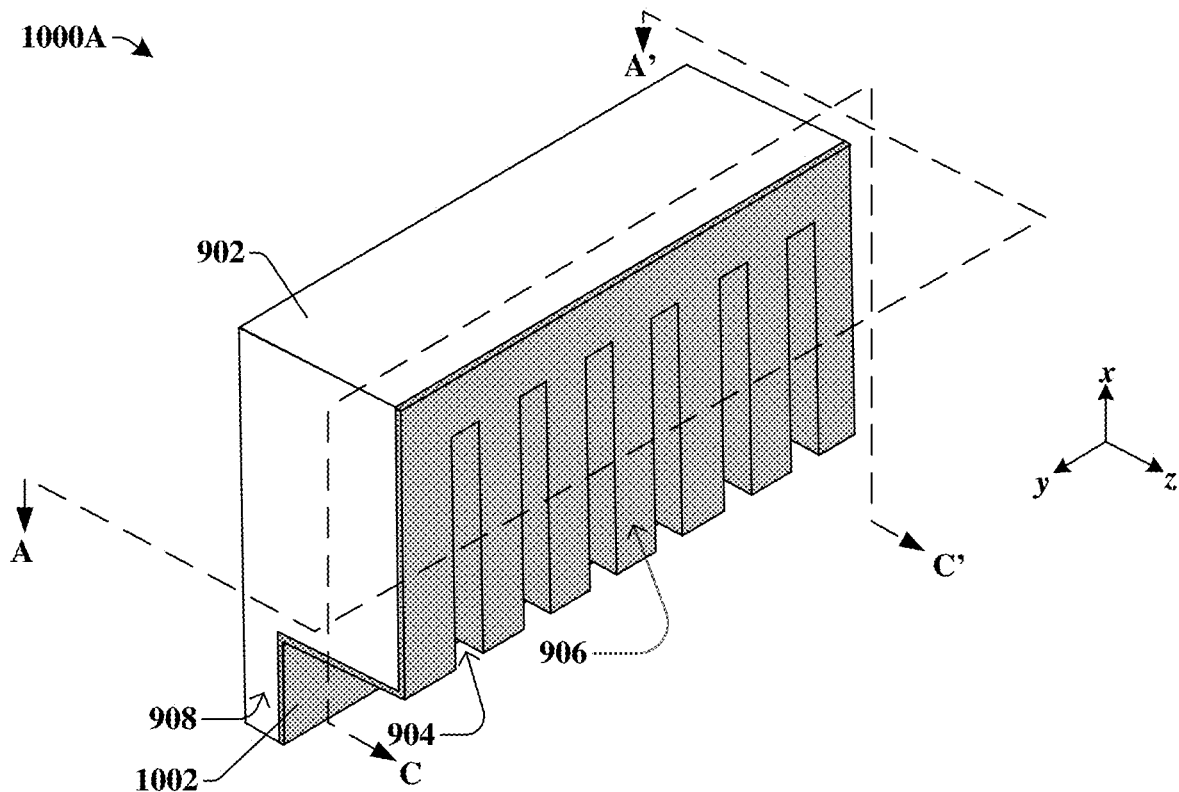

As shown in perspective view 1000A of FIG. 10A, a first dielectric layer 1002 may be formed over the substrate 902. For example, in some embodiments, the first dielectric layer 1002 is formed over the protrusions 906 of the substrate 902 and within the trench structures 904 of the substrate 902, wherein the trench structure 904 may be defined by inner surfaces of the substrate 902. In some embodiments, the first dielectric layer 1002 comprises a dielectric material such as, for example, a nitride (e.g., silicon nitride) or an oxide (e.g., silicon dioxide). In some other embodiments, the first dielectric layer 1002 comprises, for example, silicon oxynitride, a carbide (e.g., silicon carbide), a low-k oxide (e.g., a carbon doped oxide, SiCOH), or the like. In some embodiments, the first dielectric layer 1002 may be formed by way of thermal oxidation and/or deposition processes (e.g., chemical vapor deposition (CVD), physical vapor deposition (PVD), plasma enhanced CVD (PE-CVD), atomic layer deposition (ALD), etc.).

Figure 10B:
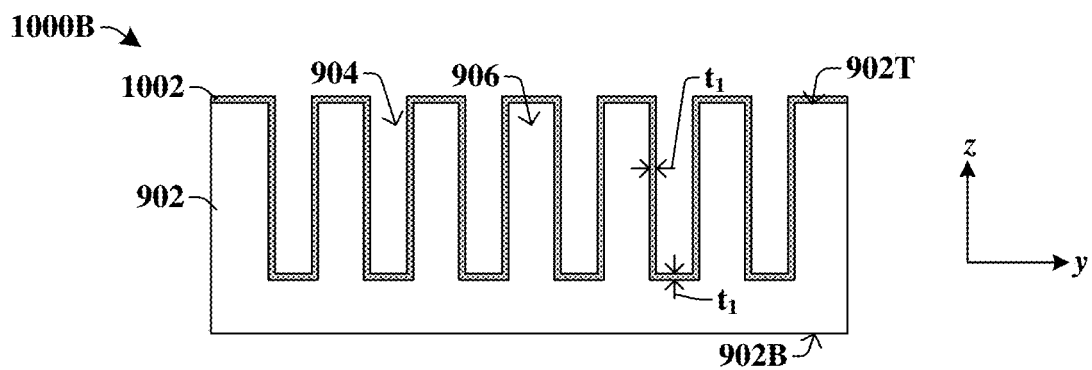

FIG. 10B illustrates cross-sectional view 1000B of some embodiments that may correspond to cross-section line AA' of FIG. 10A.

As shown in the cross-sectional view 1000B of FIG. 10B, in some embodiments, the first dielectric layer 1002 may have a first thickness $t_1$ that conformally covers the protrusions 906 and the trench structures 904 of the substrate 902. In some embodiments, the first thickness $t_1$ is in a range of between, for example, approximately 0.5 micrometers and approximately 1 micrometer. It will be appreciated that other values of the first thickness $t_1$ are also within the scope of the disclosure.

Figure 11A:
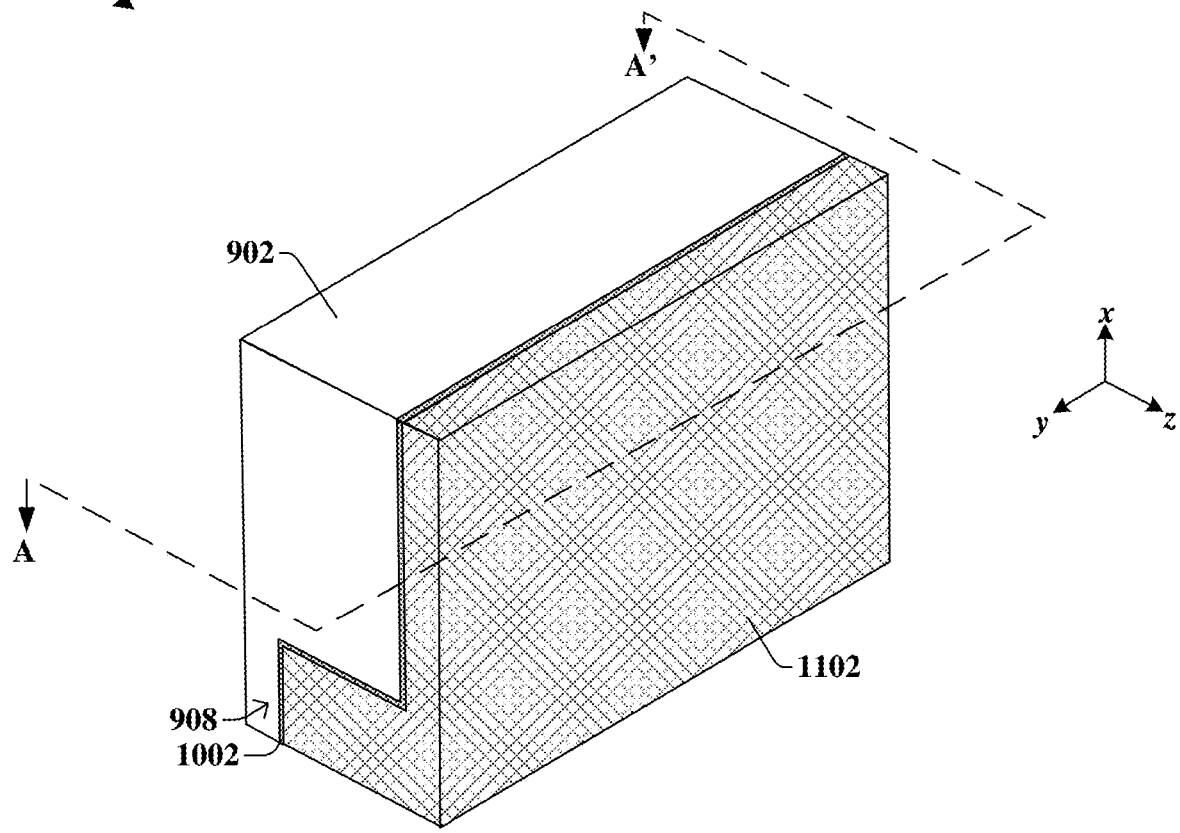

As shown in perspective view 1100A of FIG. 11A, in some embodiments, a semiconductor material 1102 is formed over the first dielectric layer 1002. In some embodiments, the first dielectric layer 1002 comprises silicon dioxide and the semiconductor material 1102 comprises polysilicon, for example. In such embodiments, the semiconductor material 1102 may be formed by an epitaxial growth process. Thus, in some embodiments, the semiconductor material 1102 may be formed in a chamber for physical vapor deposition (PVD) or chemical vapor deposition (CVD) processes. In some other embodiments, the semiconductor material 1102 may be formed in a low pressure CVD (LPCVD) chamber. It will be appreciated that other materials and deposition processes for the semiconductor material 1102 are also within the scope of the disclosure.

Figure 11B:
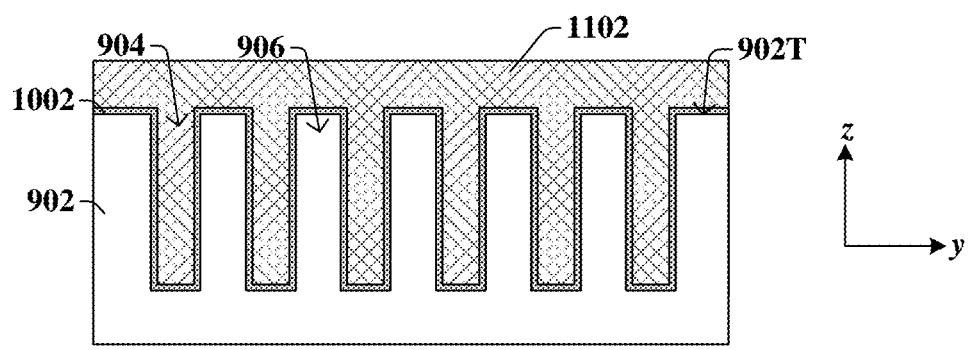

FIG. 11B illustrates cross-sectional view 1100B of some embodiments that may correspond to cross-section line AA' of FIG. 11A.

As shown in the cross-sectional view 1100B of FIG. 11B, the semiconductor material 1102 completely fills the trench structures 904 of the substrate 902. Further, in some embodiments, the semiconductor material 1102 is formed over the topmost surface 902T of the substrate 902. The semiconductor material 1102 may be separated from the substrate 902 by the first dielectric layer 1002.

Figure 12A:
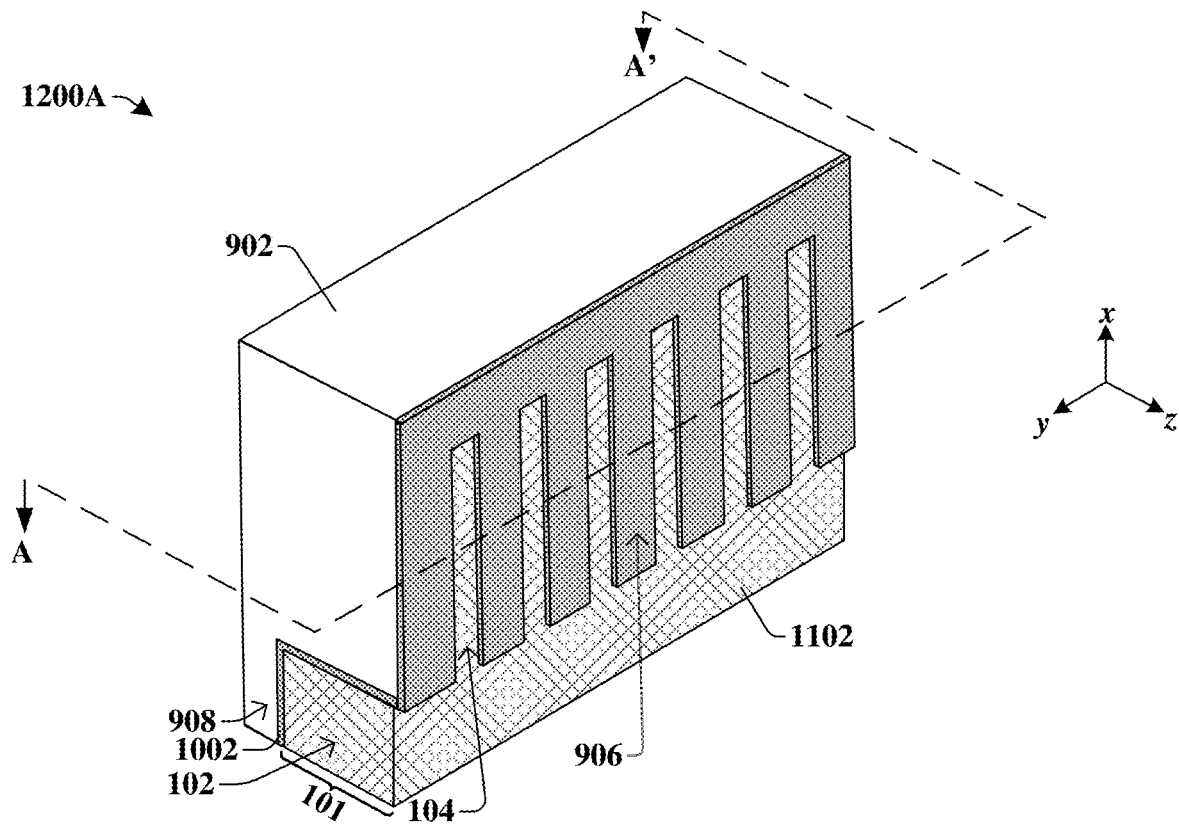

As shown in perspective view 1200A of FIG. 12A, in some embodiments, a first removal process is performed to remove upper portions of the semiconductor material 1102. The first removal process may be performed in the third direction z in some embodiments. For example, in some embodiments, the first removal process is or comprises a vertical etch. Further, in some embodiments, the first removal process removes portions of the semiconductor material 1102 but does not remove the first dielectric layer 1002. Thus, the first dielectric layer 1002 remains substantially unchanged after the first removal process, in some embodiments.

In some embodiments, after the first removal process, a MEMS comb structure 101 is formed and comprises a support layer 102 on the support portion 908 of the substrate 902 and protrusions 104 extending away from the support layer 102 in the first direction x. The protrusions 104 of the MEMS comb structure 101 are spaced apart from one another by the protrusions 906 of the substrate 902. The support layer 102 and the protrusions 104 of the MEMS comb structure 101 comprise the semiconductor material 1102.

Figure 12B:
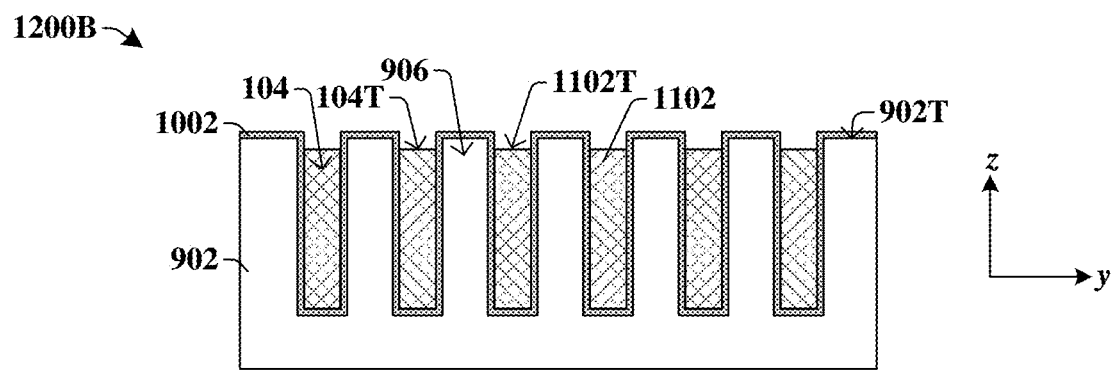

FIG. 12B illustrates cross-sectional view 1200B of some embodiments that may correspond to cross-section line AA' of FIG. 12A.

As shown in the cross-sectional view 1200B of FIG. 12B, after the first removal process, topmost surfaces 1102T of the semiconductor material 1102, or in other words, topmost surfaces 104T of the protrusions 104 of the MEMS comb structure (101 of FIG. 12A), are below the topmost surface 902T of the substrate 902. Further, after the first removal process, portions of the first dielectric layer 1002 are not completely covered by the semiconductor material 1102.

Figure 13A:
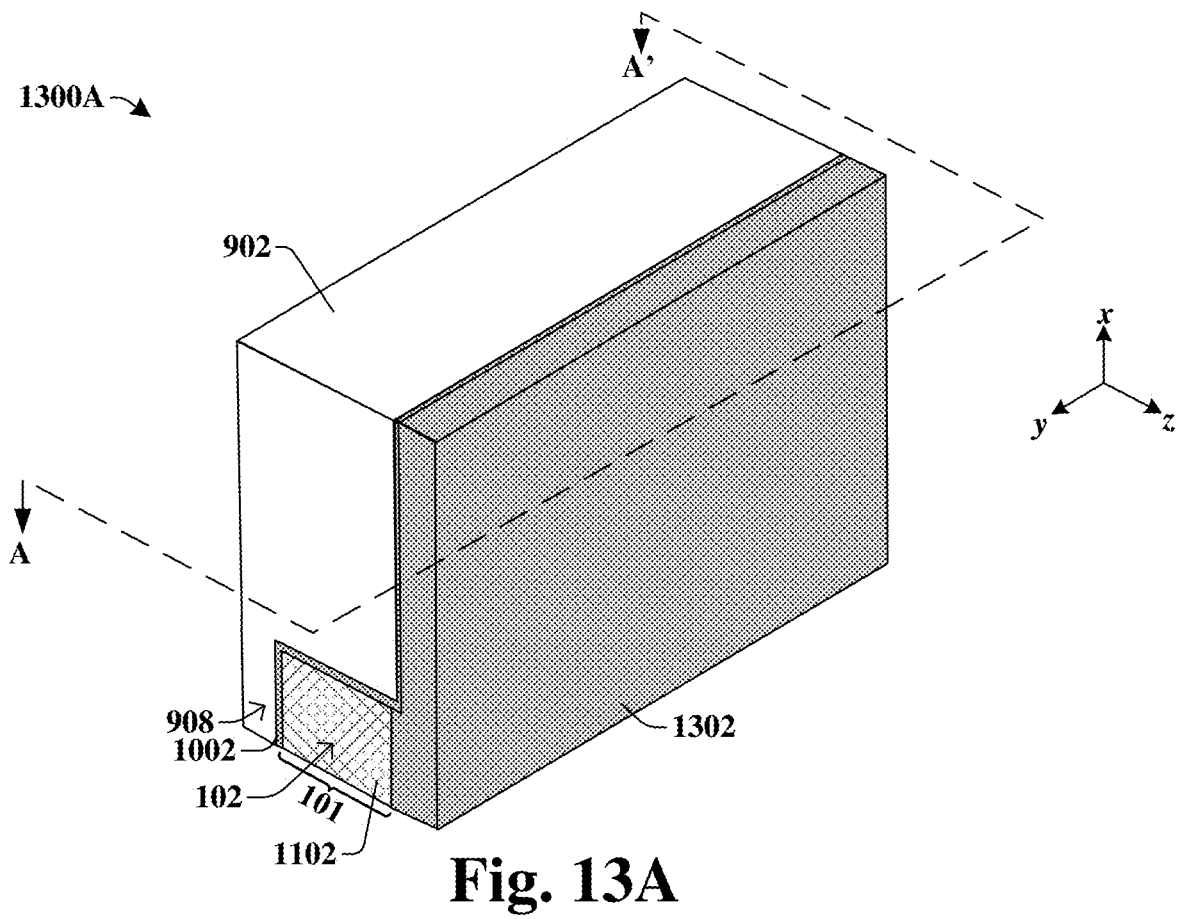

As illustrated in perspective view 1300A of FIG. 13A, in some embodiments, a second dielectric layer 1302 is formed over the semiconductor material 1102 of the MEMS comb structure 101. In some embodiments, the second dielectric layer 1302 is also formed over the first dielectric layer 1002. In some embodiments, the second dielectric layer 1302 comprises a dielectric material such as, for example, a nitride (e.g., silicon nitride) or an oxide (e.g., silicon dioxide). In some other embodiments, the second dielectric layer 1302 comprises, for example, silicon oxynitride, a carbide (e.g., silicon carbide), a low-k oxide (e.g., a carbon doped oxide, SiCOH), or the like. Thus, in some embodiments, the second dielectric layer 1302 comprises the same dielectric material as the first dielectric layer 1002. In some embodiments, the first dielectric layer 1002 may be formed by way of thermal oxidation and/or deposition processes (e.g., chemical vapor deposition (CVD), physical vapor deposition (PVD), plasma enhanced CVD (PE-CVD), atomic layer deposition (ALD), etc.). Thus, in some embodiments, the second dielectric layer 1302 is formed using the same steps as the first dielectric layer 1002.

Figure 13B:
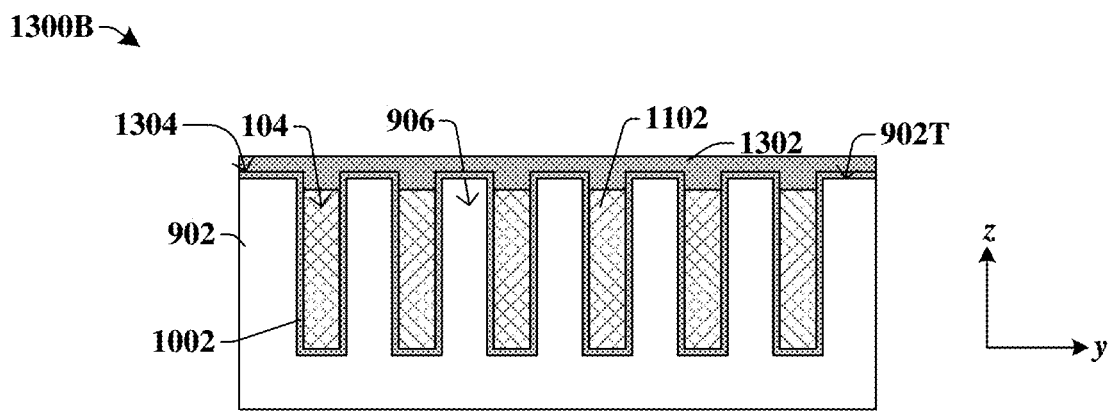

FIG. 13B illustrates cross-sectional view 1300B of some embodiments that may correspond to cross-section line AA' of FIG. 13A.

As shown in the cross-sectional view 1300B of FIG. 13B, in some embodiments, the second dielectric layer 1302 is formed over the protrusions 104 of the MEMS comb structure (101 of FIG. 13A) and over the first dielectric layer 1002. In other embodiments, the second dielectric layer 1302 may be formed directly over the protrusions 104 of the MEMS comb structure (101 of FIG. 13A) and not directly over the first dielectric layer 1002. For example, in such embodiments, the second dielectric layer 1302 may be formed by way of a thermal oxidation process. Nevertheless, in some embodiments, after the formation of the second dielectric layer 1302, the protrusions 104 of the MEMS comb structure (101 of FIG. 13A) may be completely surrounded by the first and second dielectric layers 1002, 1302. Further, in some embodiments, the first and second dielectric layers 1002, 1302 comprise the same material, and thus, an interface 1304 directly between the first and second dielectric layers 1002, 1302 may not be distinguishable. In some embodiments, the second dielectric layer 1302 has upper surfaces above the topmost surface 902T of the substrate 902 after the formation of the second dielectric layer 1302.

Figure 14A:
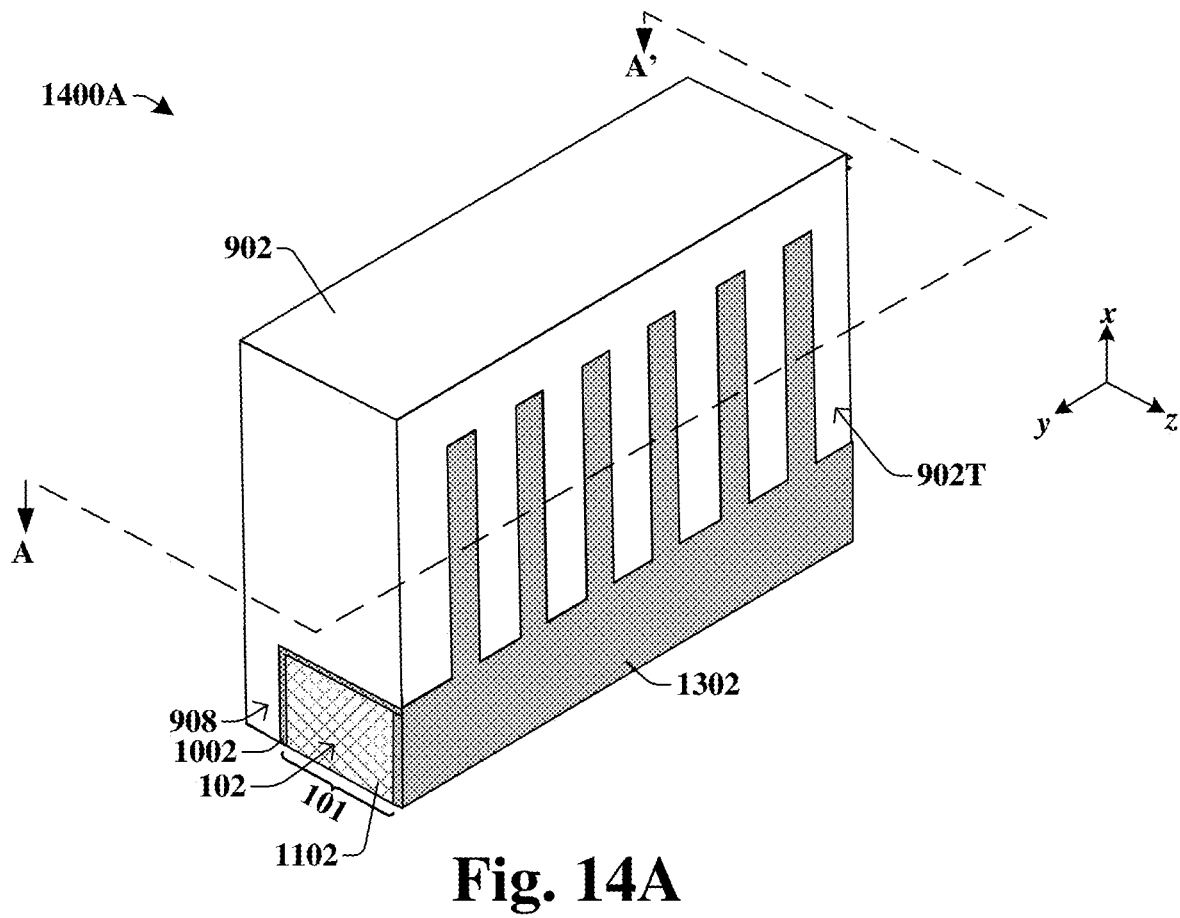

As shown in perspective view 1400A of FIG. 14A, a planarization process is formed to remove portions of the first dielectric layer 1002 and/or the second dielectric layer 1302 that are arranged over the topmost surface 902T of the substrate 902. In some embodiments, the planarization process is or comprises a chemical mechanical planarization (CMP) process. It will be appreciated that other planarization processes are within the scope of the disclosure. After the planarization process, the second dielectric layer 1302 is substantially planar with the topmost surface 902T of the substrate 902. In some embodiments, as a result of the CMP process, for example, the second dielectric layer 1302 may comprise some dishing and/or scratching.

Figure 14B:
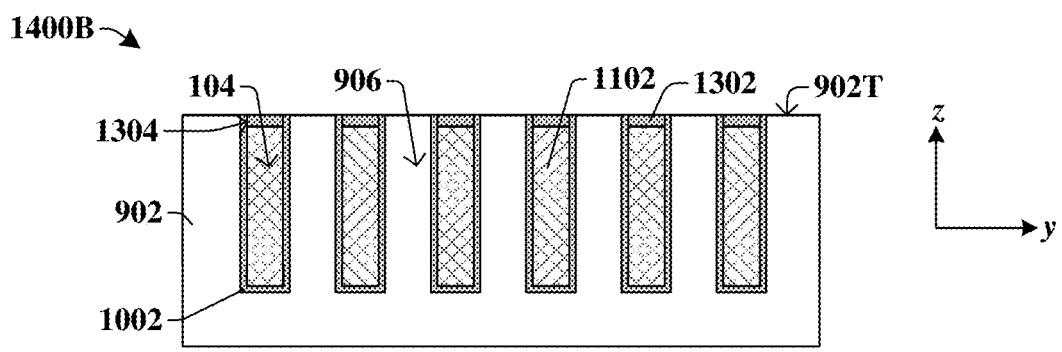

FIG. 14B illustrates cross-sectional view 1400B of some embodiments that may correspond to cross-section line AA' of FIG. 14A.

As shown in the cross-sectional view 1400B of FIG. 14B, the planarization process removes portions of the second dielectric layer 1302 that were arranged directly over the topmost surface 902T of the substrate 902. Further, in some embodiments, the planarization process removes portions of the first dielectric layer 1002 that were arranged directly over the topmost surface 902T of the substrate 902. Thus, the first dielectric layer 1002 has upper surfaces that are substantially coplanar or aligned with the upper surfaces of the second dielectric layer 1002 and with the topmost surface 902T of the substrate 902 after the planarization process.

By forming the second dielectric layer 1302 over the protrusions 104 of the MEMS comb structure (101 of FIG. 14A), the protrusions 104 of the MEMS comb structure (101 of FIG. 14A) are protected from the planarization process used to remove upper portions of the first dielectric layer 1002. Further, by performing the planarization process, the first and second dielectric layers 1002, 1302 have substantially planar upper surfaces improving control and reliability in subsequent processing steps to form a substantially uniform final dielectric liner structure around the MEMS comb structure (101 of FIG. 14A). Thus, the method of FIGS. 9A-20 to form a dielectric liner structure is a self-aligned manufacturing process at least due to the formation of the second dielectric layer 1302 of FIG. 13B and the planarization process of FIG. 14B because the formation of the second dielectric layer 1302 of FIG. 13B and the planarization process of FIG. 14B ensure that the final dielectric liner structure is not too thin and is not too thick over the protrusions 104 of the MEMS comb structure (101 of FIG. 14A) to provide electrical isolation and structural protection of the protrusions 104. Further, at FIG. 14B, after the planarization process, the first dielectric layer 1002, the second dielectric layer 1302, do not extend above the topmost surface 902T of the substrate 902 and thus, are self-aligned in the trench structures (904 of FIG. 1000B) of the substrate 902.

Figure 15A:
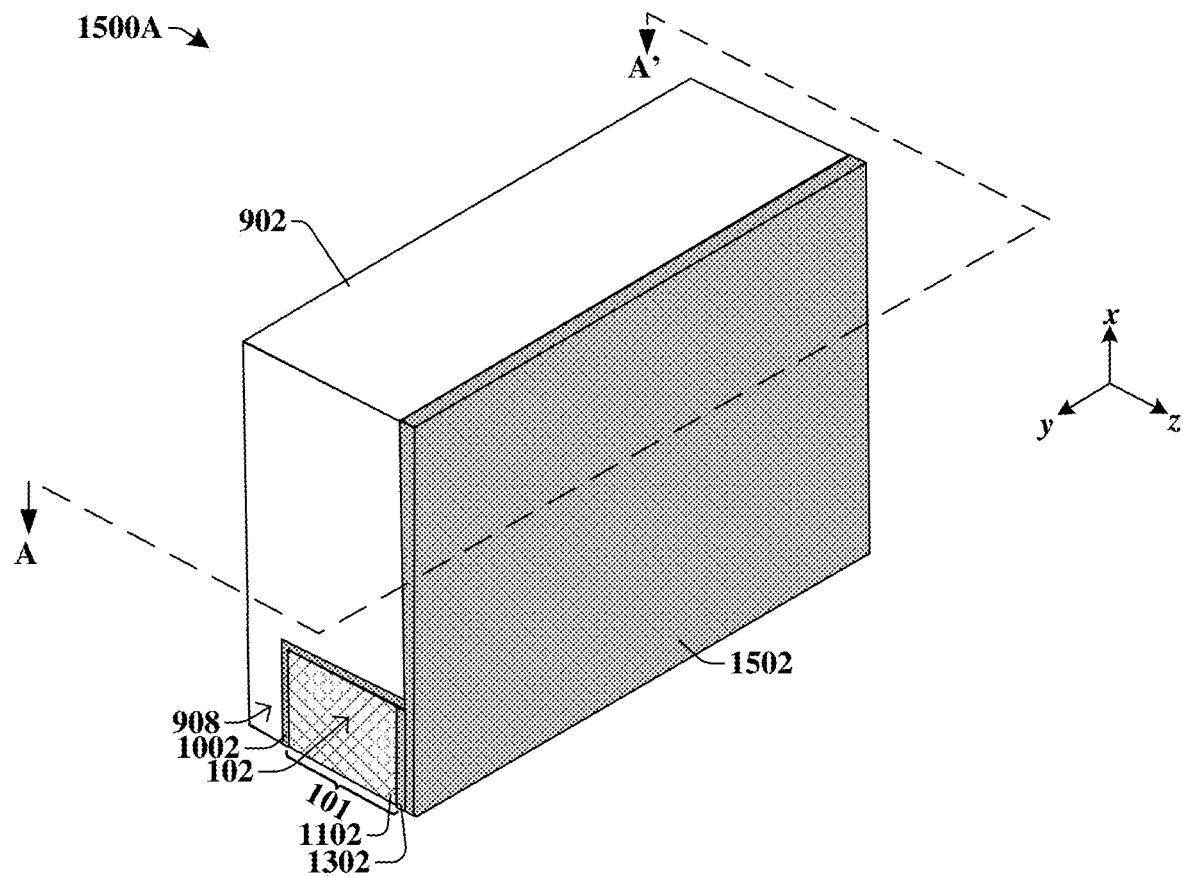

As shown in perspective view 1500A of FIG. 15A, in some embodiments, a third dielectric layer 1502 is formed over the MEMS comb structure 101. In such embodiments, the third dielectric layer 1502 is formed over the first and second dielectric layers 1002, 1302. In some embodiments, the third dielectric layer 1502 comprises a dielectric material such as, for example, a nitride (e.g., silicon nitride) or an oxide (e.g., silicon dioxide). In some other embodiments, the third dielectric layer 1502 comprises, for example, silicon oxynitride, a carbide (e.g., silicon carbide), a low-k oxide (e.g., a carbon doped oxide, SiCOH), or the like. Thus, in some embodiments, the third dielectric layer 1502 comprises the same dielectric material as the first dielectric layer 1002 and as the second dielectric layer 1302. In some embodiments, the third dielectric layer 1502 may be formed by way of thermal oxidation and/or deposition processes (e.g., chemical vapor deposition (CVD), physical vapor deposition (PVD), plasma enhanced CVD (PE-CVD), atomic layer deposition (ALD), etc.). Thus, in some embodiments, the first, second, and third dielectric layers 1002, 1302, 1502 are formed using a same process. In other embodiments, the first, second, and/or third dielectric layers 1002, 1302, 1502 may be formed by different processes. For example, in some embodiments, the first and second dielectric layers 1002, 1302 may be formed by way of thermal oxidation processes, whereas the third dielectric layer 1502 is formed by way of a PE-CVD process.

Figure 15B:
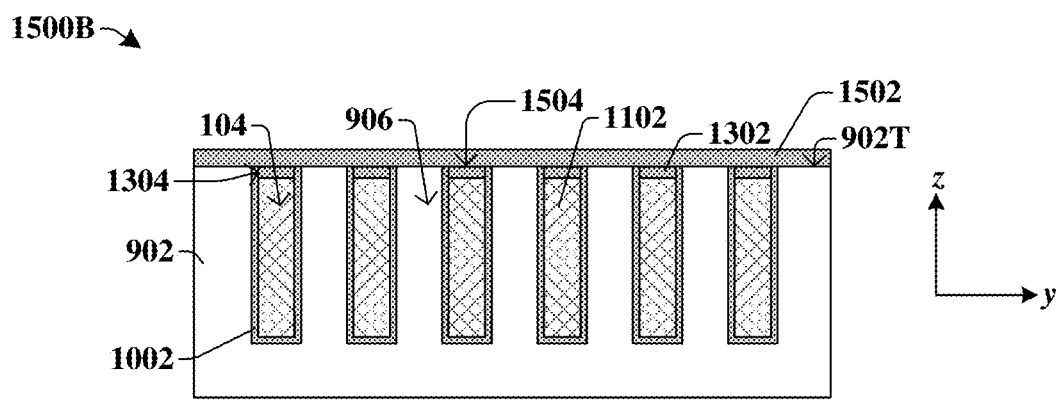

FIG. 15B illustrates cross-sectional view 1500B of some embodiments that may correspond to cross-section line AA' of FIG. 15A.

In some embodiments, the third dielectric layer 1502 may cover and/or fill in all or some of the dishing and/or scratching on the first and/or second dielectric layers 1002, 1302 caused by the planarization process of FIG. 14B. Thus, in some embodiments, an upper surface of the third dielectric layer 1502 in FIG. 15B has less scratches and/or less dishing than upper surfaces of the first and second dielectric layers 1002, 1302 after the planarization process in FIG. 14B and before the formation of the third dielectric layer 1502 of FIG. 15B.

As shown in the cross-sectional view 1500B of FIG. 15B, the third dielectric layer 1502 is formed over the topmost surface 902T of the substrate 902. Further, in some embodiments, the third dielectric layer 1502 is also formed over the first and second dielectric layers 1002, 1302. Because the first and second dielectric layers 1002, 1302 were substantially coplanar, the third dielectric layer 1502 may be substantially planar after the formation of the third dielectric layer 1502, in some embodiments. Thus, in some embodiments, the third dielectric layer 1502 may self-align with the substantially coplanar first and second dielectric layers 1002, 1302 such that the third dielectric layer 1502 is substantially planar. In other embodiments, the third dielectric layer 1502 may be formed directly over the topmost surface 902T of the substrate 902 but not directly over the first and second dielectric layers 1002, 1302. Further, in some embodiments, because the first, second, and third dielectric layers 1002, 1302, 1502 comprise a same material, an interface 1504 directly between the third dielectric layer 1502 and the first and second dielectric layers 1002, 1302 may not be distinguishable. Similarly, the interface 1304 directly between the first dielectric layer 1002 and the second dielectric layer 1302 may not be distinguishable.

Figure 16A:
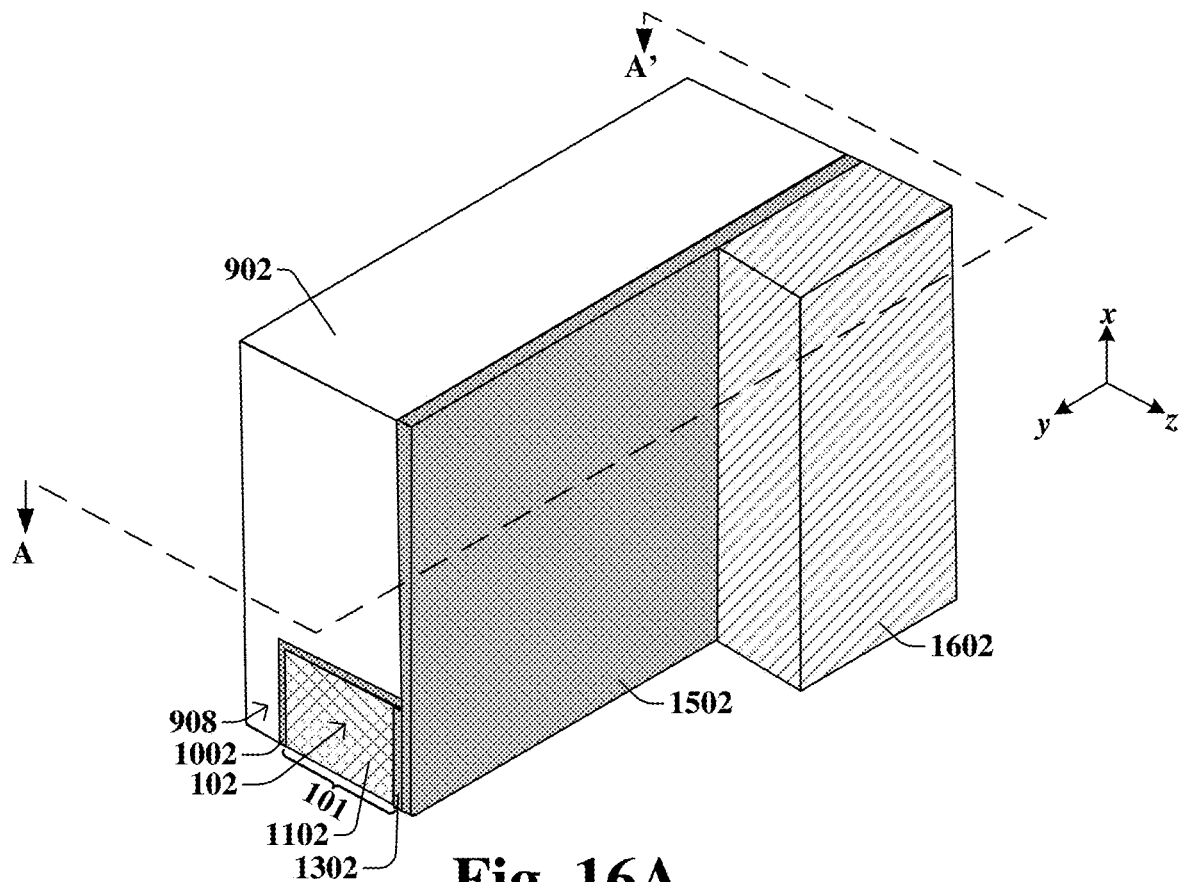

As shown in perspective view 1600A of FIG. 16A, in some embodiments, a masking structure 1602 is arranged directly over a portion of the MEMS comb structure 101. The masking structure 1602 may be formed using photolithography and removal (e.g., etching) processes. In some embodiments, the masking structure 1602 comprises a photoresist material or a hard mask material.

Figure 16B:
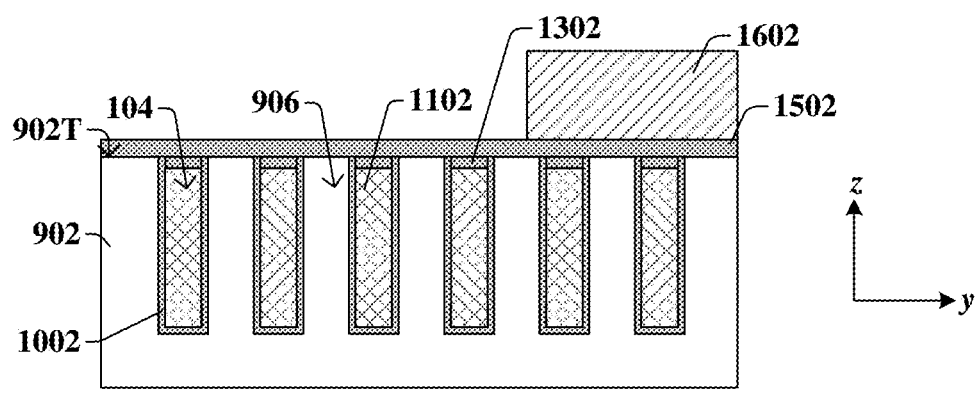

FIG. 16B illustrates cross-sectional view 1600B of some embodiments that may correspond to cross-section line AA' of FIG. 16A.

As shown in the cross-sectional view 1600B of FIG. 16B, in some embodiments, the masking structure 1602 is arranged over at least two of the protrusions 104 of the MEMS comb structure (101 of FIG. 16A). Further, the masking structure 1602 completely, continuously, and directly overlies the at least two of the protrusions 104 of the MEMS comb structure (101 of FIG. 16A).

Figure 17A:
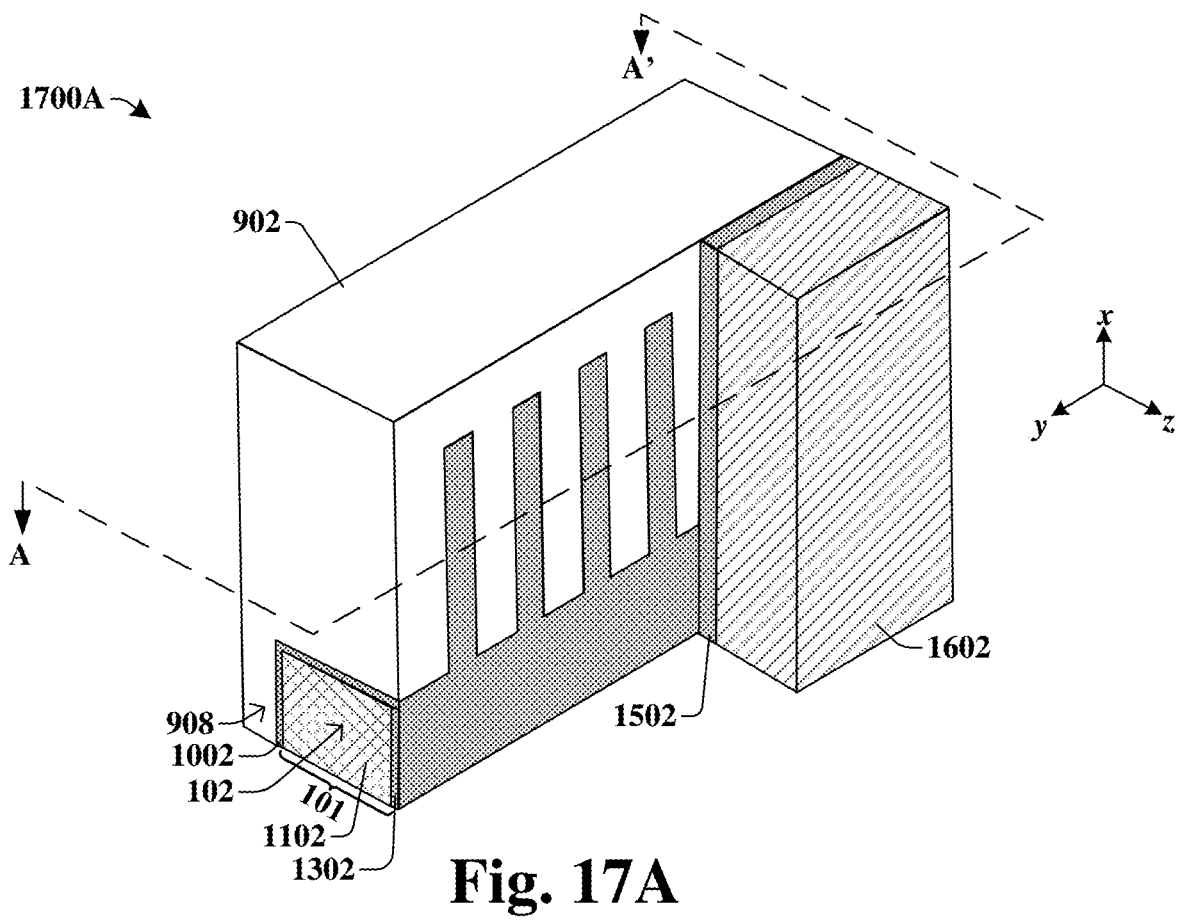

As shown in perspective view 1700A of FIG. 17A, in some embodiments, a second removal process is performed to remove portions of the third dielectric layer 1502 that do not directly underlie the masking structure 1602. In some embodiments, after the second removal process, portions of the first and second dielectric layers 1002, 1302 are exposed or in other words, uncovered by the third dielectric layer 1502. In some embodiments, the second removal process is conducted in the third direction z. For example, in some embodiments, the second removal process is or comprises a vertical etch.

Figure 17B:
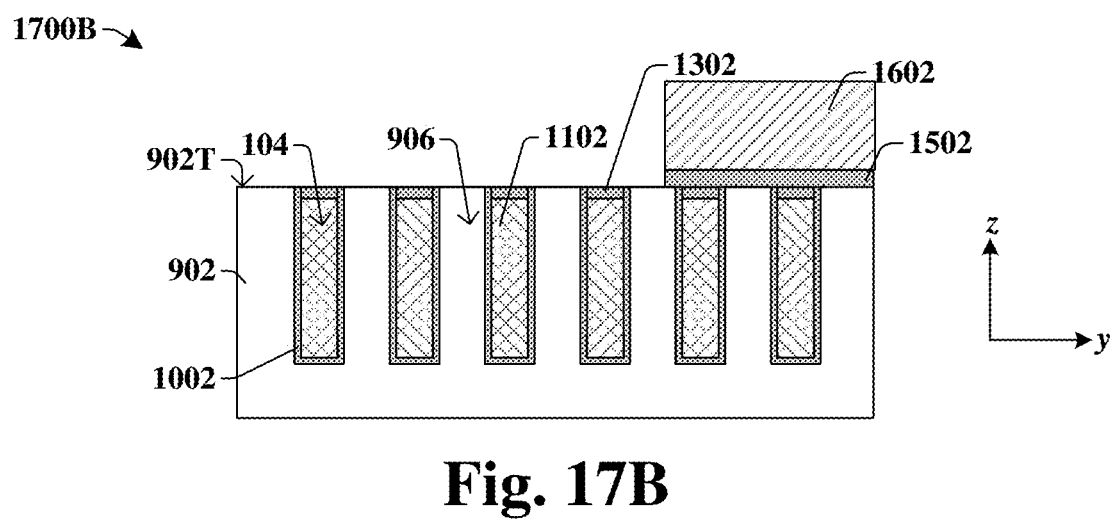

FIG. 17B illustrates cross-sectional view 1700B of some embodiments that may correspond to cross-section line AA' of FIG. 17A.

As shown in the cross-sectional view 1700B of FIG. 17B, after the second removal process, a portion of the third dielectric layer 1502 remains directly between the masking structure 1602 and the topmost surface 902T of the substrate 902. In some embodiments, the second removal process ends before the first or second dielectric layers 1002, 1302 are at risk of being removed by the second removal process. However, in some other embodiments, some upper portions of the first and/or second dielectric layers 1002, 1302 are removed as a result of the second removal process because the first and second dielectric layers 1002, 1302 comprise the same material as the third dielectric layer 1502. For example, in such other embodiments, the first and/or second dielectric layers 1002, 1302 may comprise rounded surfaces (e.g., 304, 306 of FIG. 3) after the second removal process. However, because of the planarization process in FIGS. 14A and 14B, the third dielectric layer 1502 self-aligns to the first and second dielectric layers 1002, 1302 such that the third dielectric layer 1502 is substantially planar and has a substantially constant thickness. Thus, the second removal process may be better controlled to remove the desired portions of the third dielectric layer 1502 without significant removal of the first and/or second dielectric layers 1002, 1302. In other words, because prior to the second removal process, the first, second, and third dielectric layers 1002, 1302, 1502 completely and continuously covered the protrusions 104 of the MEMS comb structure (101 of FIG. 17A), and after the second removal process, at least the first and second dielectric layers 1002, 1302 still sufficiently cover and protect the protrusions 104 of the MEMS comb structure (101 of FIG. 17A). Thus, the second removal process does not expose the protrusions 104 of the MEMS comb structure (101 of FIG. 17A).

Figure 18A:
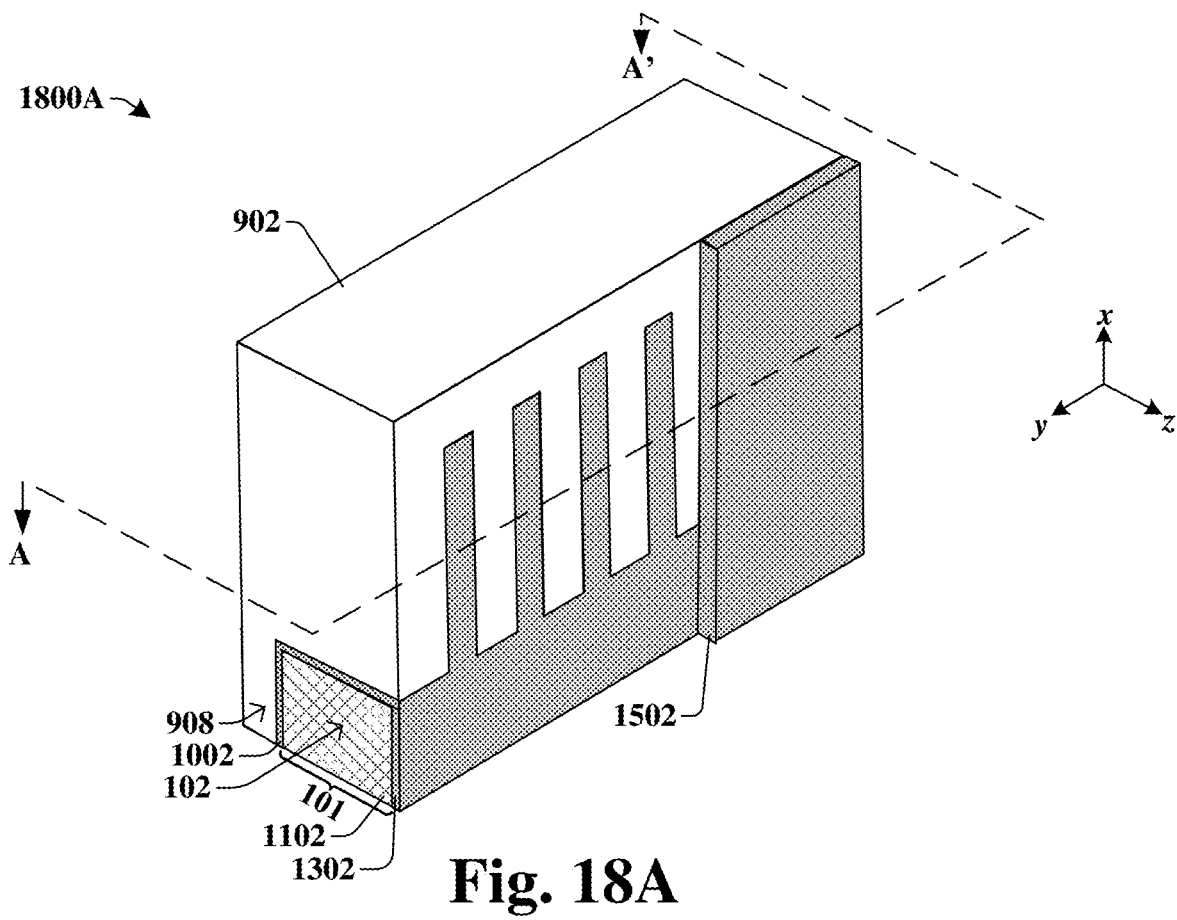

As shown in perspective view 1800A of FIG. 18A, the masking structure (1602 of FIG. 17A) is removed. In some embodiments, the masking structure (1602 of FIG. 17A) is removed by a wet etch or a dry etch. In some embodiments, the MEMS comb structure 101, the first dielectric layer 1002, the second dielectric layer 1302, and the third dielectric layer 1502 remain substantially unchanged by the removal of the masking structure (1602 of FIG. 17A).

Figure 18B:
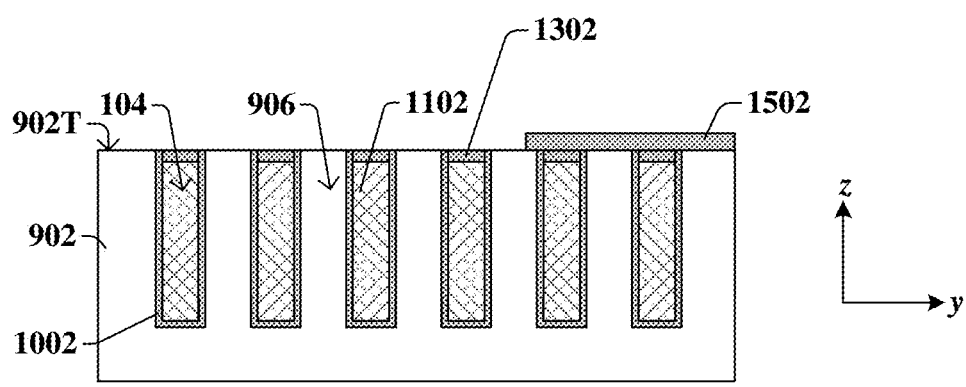

FIG. 18B illustrates cross-sectional view 1800B of some embodiments that may correspond to cross-section line AA' of FIG. 18A.

As shown in the cross-sectional view 1800B of FIG. 18B, in some embodiments, after the removal of the masking structure (1602 of FIG. 17B), the third dielectric layer 1502 connects the at least two of the protrusions 104 of the MEMS comb structure (101 of FIG. 18A).

Figure 19A:
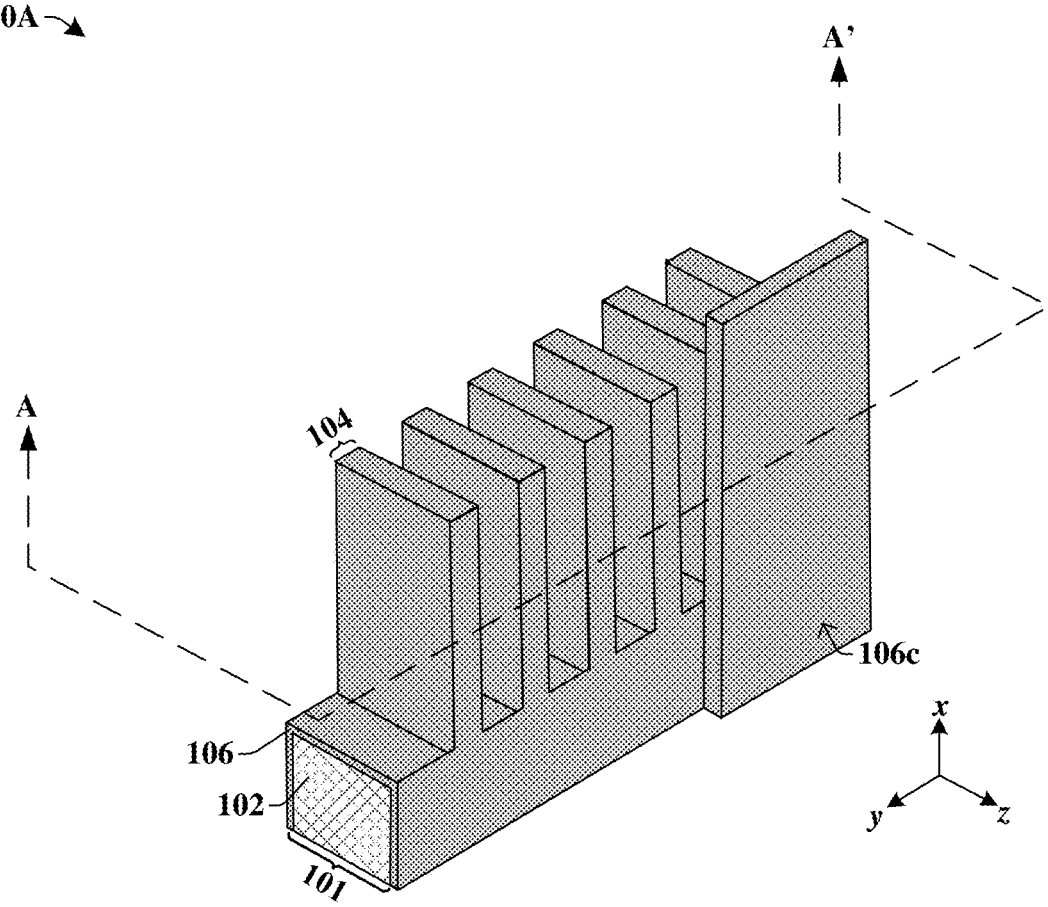

As shown in perspective view 1900A of FIG. 19A, in some embodiments, the substrate (902 of FIG. 18A) is removed from the first, second, and third dielectric layers (1002, 1302, 1502 of FIG. 18A) thereby forming a dielectric liner structure 106 arranged over the MEMS comb structure 101. The dielectric liner structure 106 comprises the first, second, and third dielectric layers (1002, 1302, 1502 of FIG. 18A) and completely and continuously surrounds the protrusions 104 of the MEMS comb structure 101. Further, the dielectric liner structure 106 may comprise a connective portion 106c that extends in the first direction x while continuously coupling the at least two of the protrusions 104 of the MEMS comb structure 101 to one another. The connective portion 106c of the dielectric liner structure 106 comprises the third dielectric layer (1502 of FIG. 18A). In some other embodiments, the connective portion 106c is not desired, and thus, the steps of forming the masking structure (1602 of FIG. 16A) in FIGS. 16A and 16B may be omitted.

In some embodiments, the substrate (902 of FIG. 18A) is removed by an etching process. In such embodiments, the etching process may be a wet or dry etch. For example, in some embodiments, the substrate (902 of FIG. 18A) is completely removed by a vertical etch in the first direction x. In other embodiments, the substrate (902 of FIG. 18A) may be partially removed by a vertical etch in the third direction z. In yet other embodiments, the substrate (902 of FIG. 18A) may be completely removed by a wet etch. Nevertheless, the substrate (902 of FIG. 18A) is released from being arranged between the protrusions 104 of the MEMS comb structure 101. Further, the MEMS comb structure 101 and the dielectric liner structure 106 remain substantially unchanged during the removal of the substrate (902 of FIG. 18A).

Figure 19B:
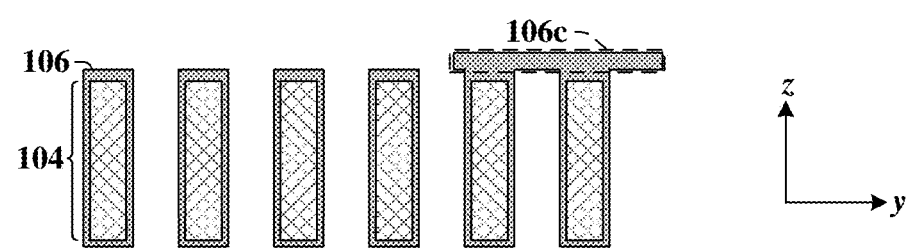

FIG. 19B illustrates cross-sectional view 1900B of some embodiments that may correspond to cross-section line AA' of FIG. 19A.

As shown in the cross-sectional view 1900B of FIG. 19B, the dielectric liner structure 106 completely and continuously covers outer surfaces of the protrusions 104 of the MEMS comb structure (101 of FIG. 19A). Further, the connective portion 106c of the dielectric liner structure 106 continuously connects upper surfaces of at least two of the protrusions 104 of the MEMS comb structure (101 of FIG. 19A).

Figure 20:
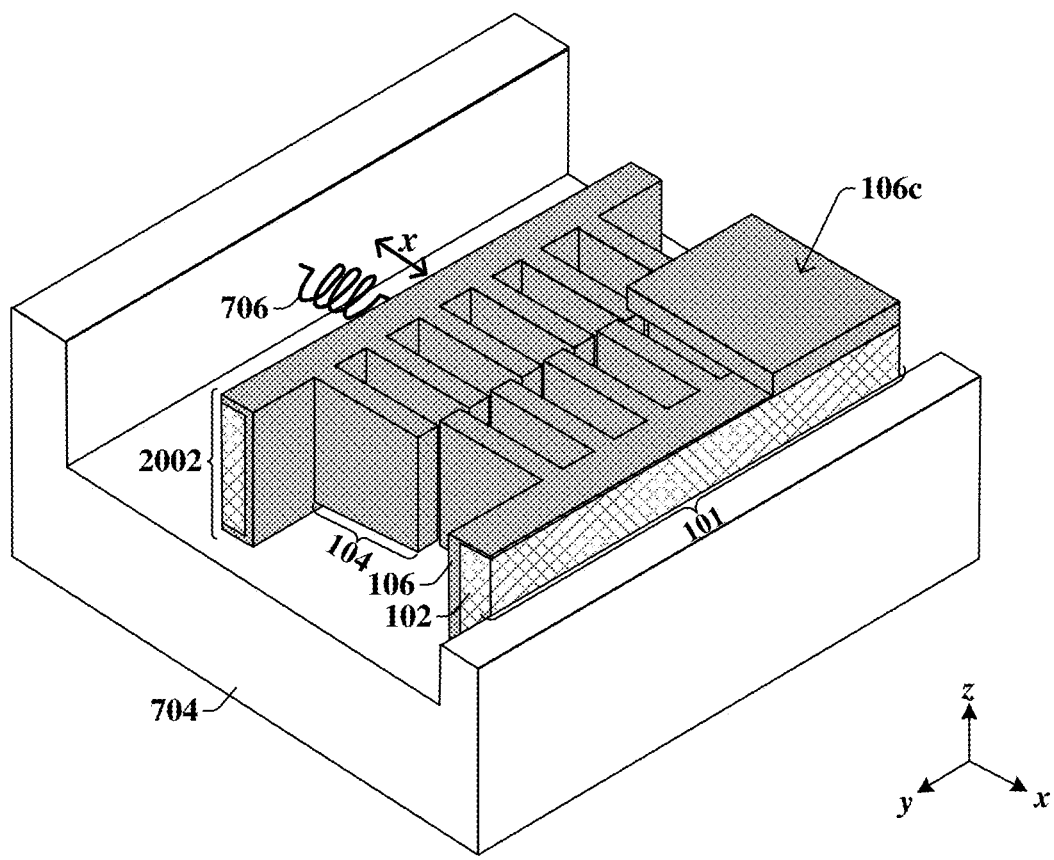

As shown in perspective view 2000 of FIG. 20, in some embodiments, the MEMS comb structure 101 may be arranged over and/or fixed to a support substrate 704 and may face an additional MEMS comb structure 2002, thereby forming a MEMS comb actuator. In some embodiments, the additional MEMS comb structure 2002 comprises a same or similar structure as the MEMS comb structure 101. In some embodiments, a spring structure 706 couples the additional MEMS comb structure 2002 to the support substrate 704. Further, in some embodiments (not shown), the MEMS comb structure 101 may also be coupled to the support substrate 704 via a spring structure. Further, in some embodiments, electrical signal sources and control circuits may be coupled to each of the MEMS comb structure 101 and the additional MEMS comb structure 2002. Thus, upon electrical signals, the MEMS comb structure 101 and the additional MEMS comb structure 2002 may move towards or away from each other in the first direction x in response to electrostatic forces between protrusions 104 of the MEMS comb structure 101 and the additional MEMS comb structure 2002. It will be appreciated that other structures/designs of features of the MEMS comb actuator (e.g., support substrate 704, additional MEMS comb structure 2002, spring structure 706, etc.) as illustrated in FIG. 20 are also within the scope of the disclosure.

The protrusions 104 of the additional MEMS comb structure 2002 are configured to fit between the protrusions 104 of the MEMS comb structure 101. Because of the self-aligned process used to form the dielectric liner structure 106 of the MEMS comb structure 101 and also, in some embodiments, the additional MEMS comb structure 2002, collision between the protrusions 104 of the additional MEMS comb structure 2002 and the protrusions 104 of the MEMS comb structure 101 is prevented. Further, because of the self-aligned process, the protrusions 104 of the additional MEMS comb structure 2002 and the protrusions 104 of the MEMS comb structure 101 are completely covered by the dielectric liner structure 106 of the additional MEMS comb structure 2002 and the dielectric liner structure 106 of the MEMS comb structure 101, and thus, shortage between protrusions 104 of the additional MEMS comb structure 2002 and the protrusions 104 of the MEMS comb structure 101 is prevented. Thus, the resulting MEMS comb actuator comprising the MEMS comb structure 101 having a dielectric liner structure 106 formed by a self-aligned process as described in FIGS. 9A-19B is more reliable.

Figure 21:
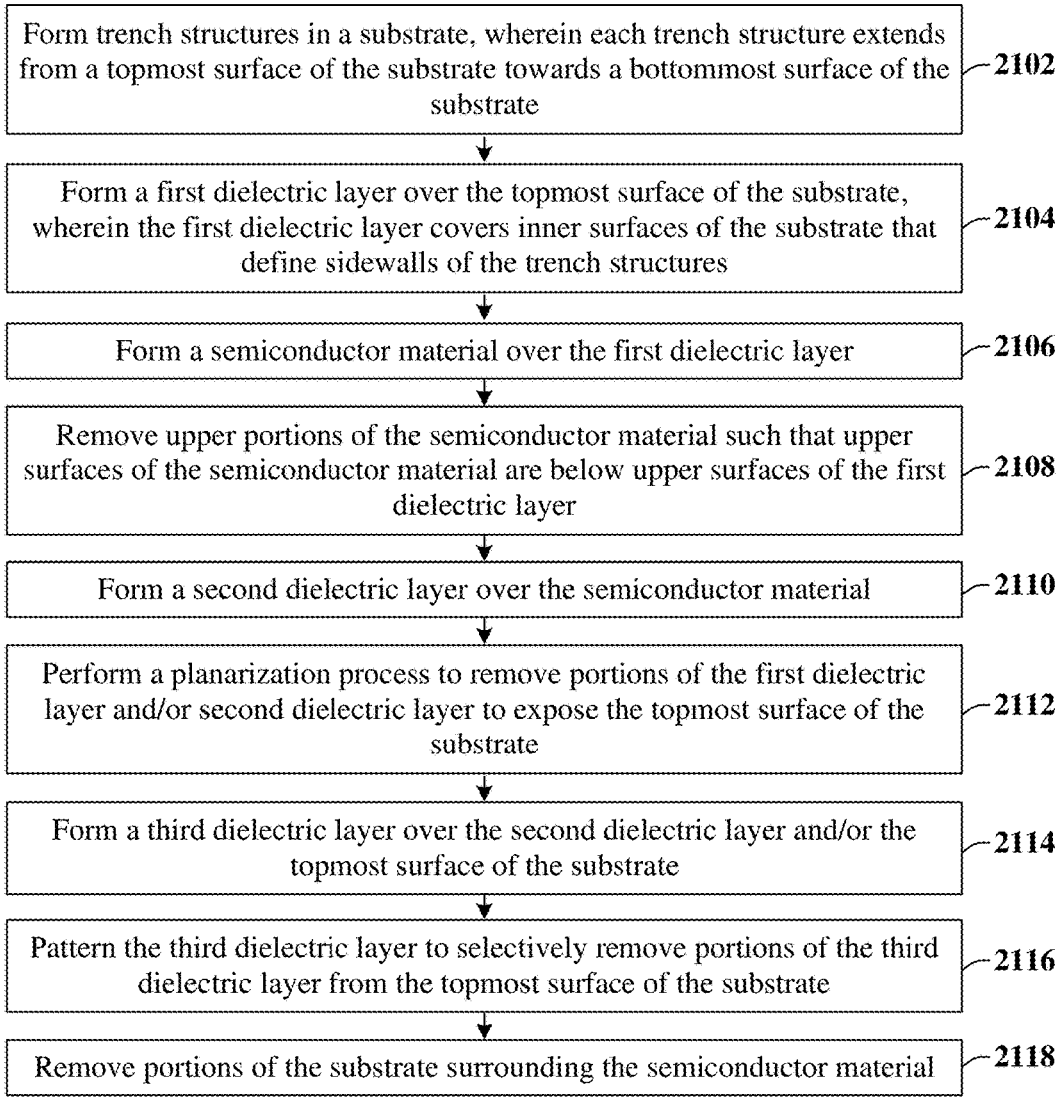
FIG. 21 illustrates a flow diagram of some embodiments corresponding to the method illustrated in FIGS. 9A-20.

FIG. 21 illustrates a flow diagram of some embodiments of a method 2100 of forming a comb structure for a MEMS comb actuator.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, trench structures in a substrate are formed. Each trench structure extends from a topmost surface of the substrate towards a bottommost surface of the substrate. FIGS. 9A and 9B illustrate perspective view 900A and cross-sectional view 900B, respectively, of some embodiments corresponding to act 2102.

At act 2104, a first dielectric layer is formed over the topmost surface of the substrate. The first dielectric layer covers inner surfaces of the substrate that define sidewalls of the trench structures. FIGS. 10A and 10B illustrate perspective view 1000A and cross-sectional view 1000B, respectively, of some embodiments corresponding to act 2104.

At act 2106, a semiconductor material is formed over the first dielectric layer. FIGS. 11A and 11B illustrate perspective view 1100A and cross-sectional view 1100B, respectively, of some embodiments corresponding to act 2106.

At act 2108, upper portions of the semiconductor material are removed such that upper surfaces of the semiconductor material are below upper surfaces of the first dielectric layer. FIGS. 12A and 12B illustrate perspective view 1200A and cross-sectional view 1200B, respectively, of some embodiments corresponding to act 2108.

At act 2110, a second dielectric layer is formed over the semiconductor material. FIGS. 13A and 13B illustrate perspective view 1300A and cross-sectional view 1300B, respectively, of some embodiments corresponding to act 2110.

At act 2112, a planarization process is performed to remove portions of the first and/or second dielectric layers to expose the topmost surface of the substrate. FIGS. 14A and 14B illustrate perspective view 1400A and cross-sectional view 1400B, respectively, of some embodiments corresponding to act 2112.

At act 2114, a third dielectric layer is formed over the second dielectric layer and/or the topmost surface of the substrate. FIGS. 15A and 15B illustrate perspective view 1500A and cross-sectional view 1500B, respectively, of some embodiments corresponding to act 2114.

At act 2116, a third dielectric layer is patterned to selectively remove portions of the third dielectric layer from the topmost surface of the substrate. FIGS. 17A and 17B illustrate perspective view 1700A and cross-sectional view 1700B of some embodiments corresponding to act 2116.

At act 2118, portions of the substrate surrounding the semiconductor material are removed. FIG. 19A illustrates a perspective view 1900A of some embodiments corresponding to act 2118.

Therefore, the present disclosure relates to a method of forming a comb structure for a MEMS comb actuator using a self-aligned process to form a uniform dielectric liner structure that surrounds each protrusion of the comb structure to successfully protect each protrusion during manufacturing and to electrically insulate each protrusion during operation. For example, at least by performing a planarization process and by forming extra dielectric layers during the self-aligned process, the dielectric liner structure is thin enough to prevent collision with another dielectric liner structure surrounding another comb structure during operation and thick enough to provide sufficient electrical isolation of the protrusions of the comb structure.

Accordingly, in some embodiments, the present disclosure relates to a microelectromechanical system (MEMS) comb actuator comprising: a comb structure comprising: a support layer comprising a first material, and a plurality of protrusions comprising the first material and extending away from a first surface of the support layer in a first direction, wherein the plurality of protrusions are separated along a second direction parallel to the first surface of the support layer; and a dielectric liner structure continuously and completely covering the first surface of the support layer and outer surfaces of the plurality of protrusions, wherein the dielectric liner structure comprises a connective portion that continuously connects topmost surfaces of at least two of the plurality of protrusions.

In other embodiments, the present disclosure relates to a microelectromechanical system (MEMS) comb actuator comprising: a comb structure comprising: a support layer comprising a semiconductor material, and a first protrusion and a second protrusion comprising the semiconductor material, extending away from the support layer in a first direction, and separated from one another in a second direction normal to the first direction; and a dielectric liner structure arranged over the comb structure and comprising: a first sidewall portion completely covering a first sidewall of the first protrusion, and a second sidewall portion completely covering a second sidewall of the first protrusion, wherein the first and second sidewall portions have respective uniform thicknesses measured in the second direction, and wherein a maximum distance of the dielectric liner structure that surrounds the first protrusion and that is measured in the second direction is between outer sidewalls of the first sidewall portion and the second sidewall portion that face away from the first protrusion.

In yet other embodiments, the present disclosure relates to a method of forming a comb structure comprising: forming trench structures in a substrate extending from a topmost surface of the substrate towards a bottommost surface of the substrate; forming a first dielectric layer over the topmost surface of the substrate, wherein the first dielectric layer covers inner surfaces of the trench structures defined by inner surfaces of the substrate; forming a semiconductor material over the first dielectric layer; removing upper portions of the semiconductor material to form a comb structure comprising protrusions within the trench structures; forming a second dielectric layer over the comb structure; performing a planarization process to remove portions of the first and/or second dielectric layers to expose the topmost surface of the substrate; forming a third dielectric layer over the second dielectric layer and/or the topmost surface of the substrate; patterning the third dielectric layer to remove portions of the third dielectric layer from the topmost surface of the substrate; and removing portions of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a comb structure comprising:
    forming trench structures in a substrate extending from a topmost surface of the substrate towards a bottommost surface of the substrate;
    forming a first dielectric layer over the topmost surface of the substrate, wherein the first dielectric layer covers inner surfaces of the trench structures defined by inner surfaces of the substrate;
    forming a semiconductor material over the first dielectric layer;
    removing upper portions of the semiconductor material to form the comb structure comprising protrusions within the trench structures;
    forming a second dielectric layer over the comb structure;
    performing a planarization process to remove portions of the first and/or second dielectric layers to expose the topmost surface of the substrate;
    forming a third dielectric layer over the second dielectric layer and/or the topmost surface of the substrate;
    patterning the third dielectric layer to remove portions of the third dielectric layer from the topmost surface of the substrate; and
    removing portions of the substrate.

2. The method of claim 1, wherein patterning the third dielectric layer comprises:
    forming a masking structure directly over at least two of the protrusions;
    performing an etching process to remove portions of the third dielectric layer arranged over the topmost surface of the substrate, wherein the portions of the third dielectric layer are not covered by the masking structure; and
    removing the masking structure.

3. The method of claim 2, wherein after the performing of the etching process, topmost surfaces of the first dielectric layer, the second dielectric layer, and the third dielectric layer that are not directly below the masking structure do not extend above the topmost surface of the substrate.

4. The method of claim 1, wherein the forming of the second dielectric layer comprises a thermal oxidation process.

5. The method of claim 1, wherein the forming of the second dielectric layer comprises a chemical vapor deposition process.

6. The method of claim 1, wherein after removing upper portions of the semiconductor material, topmost surfaces of the protrusions are below the topmost surface of the substrate.

7. The method of claim 1, wherein the first, second, and third dielectric layers comprise the same material as one another.

8. A method, comprising:
    receiving a substrate;
    forming a plurality of trenches in the substrate, the trenches extending from an upper surface of the substrate towards a lower surface of the substrate;
    forming a first dielectric layer over the upper surface of the substrate and along inner sidewalls of the plurality of trenches;
    forming a semiconductor material over the first dielectric layer, the semiconductor material filling the trenches; and
    removing upper portions of the semiconductor material to expose the first dielectric layer while leaving lower portions of the semiconductor material in the plurality of trenches, wherein the lower portions of the semiconductor material left in the trenches establish a comb structure.

9. The method of claim 8, further comprising:
    performing an etch to remove portions of the substrate to expose the first dielectric layer, wherein the etch leaves the first dielectric layer covering the comb structure.

10. The method of claim 8, further comprising:
    forming a second dielectric layer over the comb structure; and
    performing a planarization process to remove portions of the first dielectric layer and/or the second dielectric layer to expose the upper surface of the substrate.

11. The method of claim 10, wherein the forming of the second dielectric layer comprises a thermal oxidation process.

12. The method of claim 10, wherein the forming of the second dielectric layer comprises a chemical vapor deposition process.

13. The method of claim 10, further comprising:
    performing an etch to remove portions of the substrate to expose the first dielectric layer, wherein the etch leaves the first dielectric layer covering the comb structure.

14. The method of claim 10, further comprising:
    forming a third dielectric layer over the second dielectric layer and/or the upper surface of the substrate; and
    patterning the third dielectric layer to remove portions of the third dielectric layer from the upper surface of the substrate.

15. The method of claim 14, wherein the first, second, and third dielectric layers comprise the same material as one another.

16. The method of claim 14, further comprising:
performing an etch to remove portions of the substrate to expose the first dielectric layer, wherein the etch leaves the first dielectric layer covering the comb structure.

17. A method, comprising:
receiving a substrate;
forming a plurality of trenches in the substrate, the trenches extending from an upper surface of the substrate towards a lower surface of the substrate;
forming a first dielectric layer over the upper surface of the substrate and along inner sidewalls of the plurality of trenches;
forming a semiconductor material over the first dielectric layer, the semiconductor material filling the trenches;
removing upper portions of the semiconductor material to expose the first dielectric layer and leave lower portions of the semiconductor material in the plurality of trenches, the lower portions of the semiconductor material establishing a comb structure including a shaft and a plurality of teeth extending from the shaft; and
performing an etch to remove portions of the substrate to expose the first dielectric layer, wherein the etch leaves the first dielectric layer covering the shaft and the teeth of the comb structure.

18. The method of claim 17, further comprising:
forming a second dielectric layer over the comb structure; and
performing a planarization process to remove portions of the first dielectric layer and/or the second dielectric layer to expose the upper surface of the substrate.

19. The method of claim 18, further comprising:
forming a third dielectric layer over the second dielectric layer and/or the upper surface of the substrate; and
patterning the third dielectric layer to remove portions of the third dielectric layer from the upper surface of the substrate.

20. The method of claim 19, wherein the first, second, and third dielectric layers comprise the same material as one another.

* * * * *